(12) United States Patent
Hamamoto et al.

(10) Patent No.: US 6,417,715 B2
(45) Date of Patent: Jul. 9, 2002

(54) CLOCK GENERATION CIRCUIT GENERATING INTERNAL CLOCK OF SMALL VARIATION IN PHASE DIFFERENCE FROM EXTERNAL CLOCK, AND SEMICONDUCTOR MEMORY DEVICE INCLUDING SUCH CLOCK GENERATION CIRCUIT

(75) Inventors: Takeshi Hamamoto; Kiyohiro Furutani, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/793,999

(22) Filed: Feb. 28, 2001

(30) Foreign Application Priority Data

Jun. 9, 2000 (JP) ........................................ 2000-173475

(51) Int. Cl.[7] ................................................ G06F 1/04
(52) U.S. Cl. ...................................... 327/291; 327/294
(58) Field of Search ................................ 327/291, 294, 327/298, 153, 155, 158, 161, 163; 375/215, 294, 373, 376; 326/93, 95; 330/252, 253

(56) References Cited

U.S. PATENT DOCUMENTS

| 5,771,264 A | * | 6/1998 | Lane | 375/376 |
| 5,969,552 A | * | 10/1999 | Lee et al. | 327/158 |
| 5,990,714 A | * | 11/1999 | Takahashi | 327/158 |
| 6,137,328 A | * | 10/2000 | Sung | 327/158 |
| 6,157,690 A | * | 12/2000 | Yoneda | 327/158 |
| 6,240,046 B1 | * | 5/2001 | Proebsting | 365/233 |

FOREIGN PATENT DOCUMENTS

| JP | 10-190448 | 7/1998 |
| JP | 10-209828 | 8/1998 |
| JP | 11-7768 | 1/1999 |

OTHER PUBLICATIONS

"A. 0.18μm 256MB DDR-SDRAM with Low-Cost Post--Mold-Tuning Method for DLL Replica," by Kuge et al., 2000 IEEE International Solid-State Circuits Conference, pp. 402-403.

* cited by examiner

Primary Examiner—Timothy P. Callahan
Assistant Examiner—Linh Nguyen
(74) Attorney, Agent, or Firm—McDermott, Will & Emery

(57) ABSTRACT

A clock generation circuit includes a clock input circuit receiving complementary external clocks to generate an internal clock, a variable delay circuit delaying the internal clock to generate an internal operation clock, a replica circuit further delaying the internal operation clock by a predetermined time to generate a return clock, a phase comparator directly comparing the phase where potential levels of external clocks cross with the phase of the return clock, and a delay control circuit adjusting the delay amount of the variable delay circuit according to a phase comparison result of the phase comparator.

17 Claims, 19 Drawing Sheets

CLOCK GENERATION CIRCUIT GENERATING INTERNAL CLOCK OF SMALL VARIATION IN PHASE DIFFERENCE FROM EXTERNAL CLOCK, AND SEMICONDUCTOR MEMORY DEVICE INCLUDING SUCH CLOCK GENERATION CIRCUIT

BACKGROUND OF THE INVENTION

1. Field of the Invention

The present invention relates to a clock generation circuit employed in a semiconductor memory device. More particularly, the present invention relates to a clock generation circuit generating an internal clock in synchronization with an external clock, and a semiconductor memory device including such a clock generation circuit.

2. Description of the Background Art

In a semiconductor device that operates in synchronization with an external clock such as an SDRAM (Synchronous Dynamic Random Access Memory), a clock generation circuit is provided in the semiconductor device. The internal circuit of the semiconductor device is generally controlled using an internal clock in synchronization with an external clock.

The circuit controlling the data input/output interface for the semiconductor device to send/receive data to/from an external source is under control using such an internal clock. Therefore, the data input/output timing is greatly influenced by the phase accuracy of the internal clock. The data output timing of an SDRAM will be described hereinafter as a typical example.

Referring to the timing chart of FIG. 22, a dock input circuit recognizes input of an external clock EXT.CLK at a timing (time t0) when the rising edge of external clock EXT.CLK exceeds the reference potential VREF. At time t1 corresponding to an elapse of tD1 from time t0, the clock input circuit renders internal clock CLKI active. This delay tD1 corresponds to the phase delay generated in the clock input circuit.

A data output operation is initiated with internal clock CLKI as a trigger. At time t2 corresponding to an elapse of tD2 from time t1, output data DOUT is provided. Therefore, access time tAC defined starting from the excess of external clock EXT.CLK over reference potential VREF up to excess of output data DOUT over a potential VTT which is the output terminate level is the sum of delay tD1 generated in the clock input circuit and delay tD2 generated in the data output operation. In a general SDRAM, the specification value of access time tAC is limited to 3 nsec-6 nsec. Delay time tD1 generated in the clock input terminal greatly affects access time tAC.

In accordance with the necessity of the semiconductor device operating at high frequency, the need arises to reduce the phase difference between the external clock edge and the input/output timing with respect to the semiconductor device. This is because the deviation in phase between the external clock edge and the data input/output timing is increased relatively with respect to the cycle of the external clock as the frequency of the external clock which is the reference in the operation of the semiconductor device becomes higher. The phase deviation will become too great to be neglected. In other words, the phase difference between the external clock edge and the operation timing of the input/output interface must be minimized in order to execute properly the command and data input/output with respect to the semiconductor device based on the external clock edge.

FIG. 23 is a timing chart of data output in a DDR-SDRAM (Double Data Rate-SDRAM).

Referring to FIG. 23, access time tAC corresponds to the period of time starting from time t0 corresponding to the crossing point of the potential levels of external clock EXT.CLK and an inverted clock EXT./CLK up to time t1 where output data DOUT exceeds the output terminate potential level VTT in a DDR-SDRAM.

In a DDR-SDRAM that inputs/outputs data in synchronization with both the rising and falling edges of an external clock, it is required that access time tAC takes a small value. The general specification of access time tAC is approximately ±0.75 nsec. In order to satisfy this access time specification, a clock generation circuit must be provided internally to control the phase difference between external clock EXT.CLK and internal clock CLKI, i.e. delay tD1 occurring at the time of internal clock generation according to external clock EXT.CLK. A DLL (Delay Locked Loop) generally formed of a variable delay circuit and a phase comparator or a PLL (Phase Locked Loop) is generally applied as such a clock generation circuit.

A structure of a clock generation circuit using a DLL employed in a conventional DDR-SDRAM will be described hereinafter.

FIG. 24 is a block diagram showing a structure of a conventional clock generation circuit employing a DLL.

Referring to FIG. 24, the clock generation circuit includes a clock input circuit 125, a variable delay circuit 130, replica circuits 140 and 160, a phase comparator 200, and a delay control circuit 150.

Clock input circuit 125 detects the crossing point of the potential levels of external clock EXT.CLK and inverted clock EXT./CLK forming complementary clocks to generate an internal clock CLK1. If the time required to generate internal clock CLK1 in clock input circuit 125 is tD1, internal clock CLK1 already lags in phase by delay tD1 from the crossing point of the potential levels of the complementary clocks at this stage.

Variable delay circuit 130 further delays internal clock CLK1 to generate an internal operation clock CLK2. Data output control circuit 50 operates in response to internal operation clock CLK2 to provide data DOUT to a data input/output terminal EXT.DQ.

Assuming that the cycle of external clock EXT.CLK is tCLK and the time required from activation of internal operation clock CLK2 up to the output of data DOUT is tD2, access time tAC can be set equal to external clock cycle tCLK by setting the delay time of variable delay circuit 130 to "tCLK−(tD1+tD2)" by delay control circuit 150. In this case, access time tAC is equivalently 0 as to the data output interface when viewed from outside the semiconductor device. Data output will be executed at a timing in synchronization with the external clock edge.

Since the delay value of variable delay circuit 130 is set to the foregoing "tCLK−(tD1+tD2)", internal operation clock CLK2 is further delayed by two replica circuits 140 and 160 to be applied to phase comparator 200 as return clock RCLK. Replica circuit 140 functions to replicate the delay corresponding to delay amount tD2 generated at data output control circuit 50 with respect to internal operation clock CLK2. Similarly, replica circuit 160 replicates delay corresponding to delay amount tD1 generated at clock input circuit 125 with respect to the output of replica circuit 140.

Phase comparator 200 compares the phases between return clock RCLK output from replica circuit 160 and internal clock CLK1 of one succeeding cycle to generate a control signal UP/DOWN to increase/decrease the amount of delay of variable delay circuit 130 according to the phase difference.

Delay control circuit 150 generates a delay control signal CTRL according to control signals UP and DOWN to adjust the delay amount of variable delay circuit 130. When the phases of internal clock CLK1 and return clock RCLK match, delay control signal CTRL takes a certain fixed value, whereby the delay amount of variable delay circuit 130 is fixed. In this state, internal clock CLK1 is in phase with return clock RCLK. This state is called "lock state" hereinafter.

Therefore, internal operation clock CLK2 is ahead in phase of internal clock CLK1 output from clock input terminal 125 by the delay amount applied at replica circuits 140 and 160. When the sum of the delay amount of replica circuits 140 and 160 exactly matches (tD2+tD1), the delay value of variable delay circuit 130 becomes "tCLK−(tD1+tD2)", so that access time tAC seems to be 0, as mentioned before.

FIG. 25 is a block diagram showing another structure of a clock generation circuit employed in a DDR-SDRAM.

Referring to FIG. 25, the clock generation circuit generates internal operation clocks FCLK2 and BCLK2 corresponding to both the rising and falling edges of external clock EXT.CLK.

More specifically, the clock generation circuit includes a clock input circuit 125a responsive to a rising edge of external clock EXT.CLK to generate internal clock FCLK1, and a clock input circuit 125b responsive to a falling edge of external clock EXT.CLK to generate internal clock BCLK1.

Clock generation circuit 510 has the so-called dual delay line structure including variable delay circuits 130a and 130b corresponding to internal clocks FCLK1 and BCLK1, respectively.

Variable delay circuit 130a delays internal clock FCLK1 to generate an internal operation clock FCLK2, whereas variable delay circuit 130b delays internal clock BCLK1 to generate an internal operation clock BCLK2. Data output control circuit 50 responds to both internal operation clocks FCLK2 and BCLK2 to execute data output.

A DLL formed of variable delay circuit 130a, replica circuits 140 and 160, phase comparator 200 and delay control circuit 150, similar to the clock generation circuit shown in FIG. 24, is provided with respect to internal clock FCLK1. Synchronization can be established between the data output timing in response to internal operation clock FCLK2 and the rising edge of external clock EXT.CLK.

Since a delay amount identical to that of the variable delay circuit 130a is applied by variable delay circuit 130b also for internal clock BCLK1 generated in response to the falling edge of external clock EXT.CLK, internal operation clocks FCLK2 and BCLK2 can be rendered active alternately at a predetermined cycle.

As a result, data is output at the equivalent status of access time tAC=0 in synchronization with both the rising and falling edges of external clock EXT.CLK, when viewed from outside the semiconductor device.

Problems in the conventional clock generation circuit employing a DLL will be described based on a timing chart.

FIGS. 26A–26C are timing charts representing the operation of a conventional clock generation circuit shown in FIG. 24.

FIG. 26A corresponds to the case where data is output at the normal timing. Referring to FIG. 26A, internal clock CLK1 is rendered active at time t1 corresponding to an elapse of delay tD1 by the clock input circuit from time t0 where the potential levels of external clock EXT.CLK and inverted clock EXT./CLK become equal.

By the operation of the DLL, return clock RCLK is in phase with internal clock CLK1. Internal operation clock CLK2 is generated at a phase ahead of internal clock CLK1 by the delay time sum of tR2+tR1 by replica circuits 140 and 160. Output data Dout is output at time t0 delayed by tD2 from the activation timing of output trigger circuit CLK2.

Since the delay amounts set at replica circuits 160 and 140 are respectively equal to delay amount tD1 of clock input circuit 125 and delay amount tD2 of data output control circuit 150, access time tAC becomes 0 equivalently.

FIG. 26B corresponds to the case where the through rate of the rise and fall of external clock EXT.CLK and inverted clock EXT./CLK is small and the rising/falling time is great. Delay time tD1 generated at delay input circuit 125 is greater than that of FIG. 26A. Therefore, the actual delay time tD1 of clock input circuit 125 will become longer than delay time tR1 set at replica circuit 160, so that the output timing of output data DOUT is no longer in synchronization with external clock EXT.CLK. Therefore, the access time tAC will be generated at the plus side.

In contrast, when the through rate of the rise and fall of external clock EXT.CLK and inverted clock EXT./CLK is great and the rising/falling time is short as shown in FIG. 26C, the actual delay time tD1 of clock input circuit 125 will become shorter than delay time tR1 set at replica circuit 160, opposite to that of FIG. 26B. As a result, external clock EXT.CLK is no longer in synchronization with the data output timing. Access time tAC will be generated at the minus side.

According to the structure of a conventional clock generation circuit that compensates for the delay generated at a clock input circuit by a replica circuit provided in the DLL, access tAC will vary according to the change in the through rate of the external clock.

Access time tAC also varies in response to the change in the potential levels at the crossing points of external clock EXT.CLK and inverted clock EXT./CLK. Furthermore, access time tAC varies when the actual amount of delay generated at the replica circuit and the clock input circuit differs from the predetermined designed value caused by variation in the waveform of the external clock as well as variation in the power supply voltage, power supply noise, temperature condition and the process. If access time tAC greatly varies by these factors, the specification of the data output timing cannot be satisfied. As a result, the semiconductor device cannot operate correctly.

SUMMARY OF THE INVENTION

An object of the present invention is to provide a clock generation circuit that can generate an internal clock of small variation in phase difference from an external clock, impervious to variation in the delay generated at a clock input circuit, and a semiconductor memory device including such a clock generation circuit.

According to an aspect of the present invention, a clock generation circuit supplying an operation clock in synchronization with an external clock to an internal circuit executing a predetermined operation includes a first clock input circuit, a first variable delay circuit, a first replica delay circuit, a first phase comparator, and a first delay control circuit. The first clock input circuit receives an external clock and an external reference clock which is a clock signal complementary to the external clock to generate a first internal clock. The first internal clock repeats transition between a first potential and a second potential according to potential level difference between the external clock and the external reference clock. The first variable delay circuit delays the first internal clock to generate a second internal clock supplied to the internal circuit as an operation clock. The first replica delay circuit further delays the second internal clock for a first predetermined time corresponding to the time required for a predetermined operation of the internal circuit to generate a third internal clock. The first phase comparator compares the phase where the potential levels of the external clock and the external reference clock cross with the phase of the third internal clock. The first delay control circuit controls a delay amount of the first variable delay circuit according to the phase comparison result of the first phase comparator.

According to another aspect of the present invention, a clock generation circuit supplying an operation clock in synchronization with an external clock to an internal circuit that carries out a predetermined operation includes a phase comparator, a delay control circuit, a control circuit, and a variable delay circuit. The phase comparator compares the phase where potential levels of the external clock and an external reference clock which is a clock signal complementary to the external clock cross with the phase of the operation clock. The delay control circuit generates a delay control signal according to the phase comparison result of the phase comparator. The control circuit generates an internal clock according to the operation clock. The variable delay circuit delays the internal clock according to the delay control signal to generate an operation clock.

According to a further aspect of the present invention, a semiconductor memory device operating in synchronization with an external clock includes a clock generation circuit. The clock generation circuit generates an operation clock to control the timing of the internal operation of the semiconductor memory device in synchronization with an external clock. The clock generation circuit includes a first clock input circuit receiving an external clock and an external reference clock which is a clock signal complementary to the external clock to generate a first internal clock. The first internal clock repeats a status transition according to the potential level of difference between the external clock and the external reference clock. The clock generation circuit further includes a variable delay circuit delaying the first internal clock to generate an operation clock, a replica delay circuit further delaying the operation clock for a predetermined time to generate a second internal clock, a phase comparator comparing the phase where potential levels of the external clock and the external reference clock cross with the phase of the second internal clock, and a delay control circuit controlling a delay amount of the variable delay circuit according to the phase comparison result of the phase comparator.

The main advantage of the present invention is that variation in the delay time caused in converting an external clock into an internal clock caused by variation in the external clock waveform, power supply voltage, power supply noise, temperature condition, process, and the like can be suppressed from adversely affecting the phase accuracy of the internal clock to maintain the phase accuracy of the internal clock favorably since the phase of the internal clock input to the phase comparator is directly compared with the phase where the potential levels of complementary external clocks cross.

In the case where an internal operation clock is generated using a PLL with complementary external clocks as the reference, variation in the delay time generated in the conversion of the external clock to the internal clock caused by variation in the external clock waveform, power supply voltage, power supply noise, temperature condition, process, and the like can be suppressed from adversely affecting the phase accuracy of the internal operation clock. Therefore, the phase accuracy of the internal operation clock can be maintained favorably.

Furthermore, the internal operation timing of the semiconductor memory device is controlled using an operation clock of small phase error generated by a clock generation circuit that directly compares the phase of the internal clock input to the phase comparator with the phase where potential levels of complementary external clocks cross. As a result, the semiconductor memory device can be operated properly at a predetermined timing in synchronization with complementary external clocks impervious to variation in the delay time generated when the external clock is converted into an internal clock.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
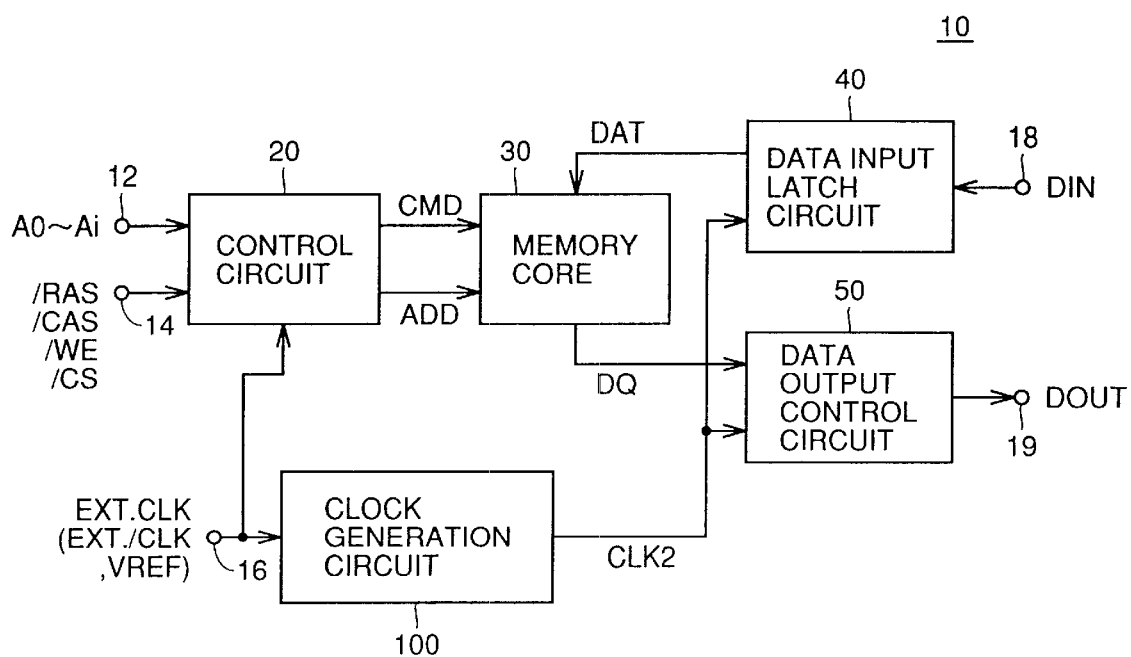
FIG. 1 is a block diagram schematically showing a structure of a semiconductor memory device 10 including a clock generation circuit according to a first embodiment of the present invention.

Embodiments of the present invention will be described with reference to the drawings. In the drawings, the same reference characters denote the same or corresponding components, and description thereof will not be repeated.

First Embodiment

Referring to FIG. 1, a semiconductor memory device 10 with a clock generation circuit according to a first embodiment of the present invention includes an address terminal 12, a command control terminal 14, a clock terminal 16, a data input terminal 18, a data output terminal 19, a control circuit 20, a memory core 30, a data input latch circuit 40, a data output control circuit 50, and a clock generation circuit 100. In FIG. 1, only the main components associated with data input/output are depicted representative of the entire structure of the semiconductor memory device.

Address terminal 12 receives an address signal input of (i+1) bits formed of address bits A0-Ai (i: natural number). Command control terminal 14 receives the input of command control signals such as a row address strobe signal /RAS, a column address strobe signal /CAS, a write enable signal /WE, a chip select signal /CS, and the like. Clock terminal 16 receives the input of an external clock EXT.CLK. The external clock includes inverted clock EXT./CLK complementary to external clock EXT.CLK and the reference potential VREF defining the rising edge of external clock EXT.CLK.

Control circuit 20 receives the address signal and the command control signal at a timing in synchronization with external clock EXT.CLK to generate a command CMD and an address signal ADD with respect to memory core 30 in response to the input address signal and command control signal. Memory core 30 carries out an operation in response to command CMD and address signal ADD to perform data reading and writing.

Clock generation circuit 100 generates an internal operation clock CLK2 in synchronization with external clock EXT.CLK. A data input latch circuit 40 and a data output control circuit 50 operate in response to internal operation clock CLK2 to latch input data DIN of data input terminal 18 and output data DOUT at data output terminal 19.

Figure 2:
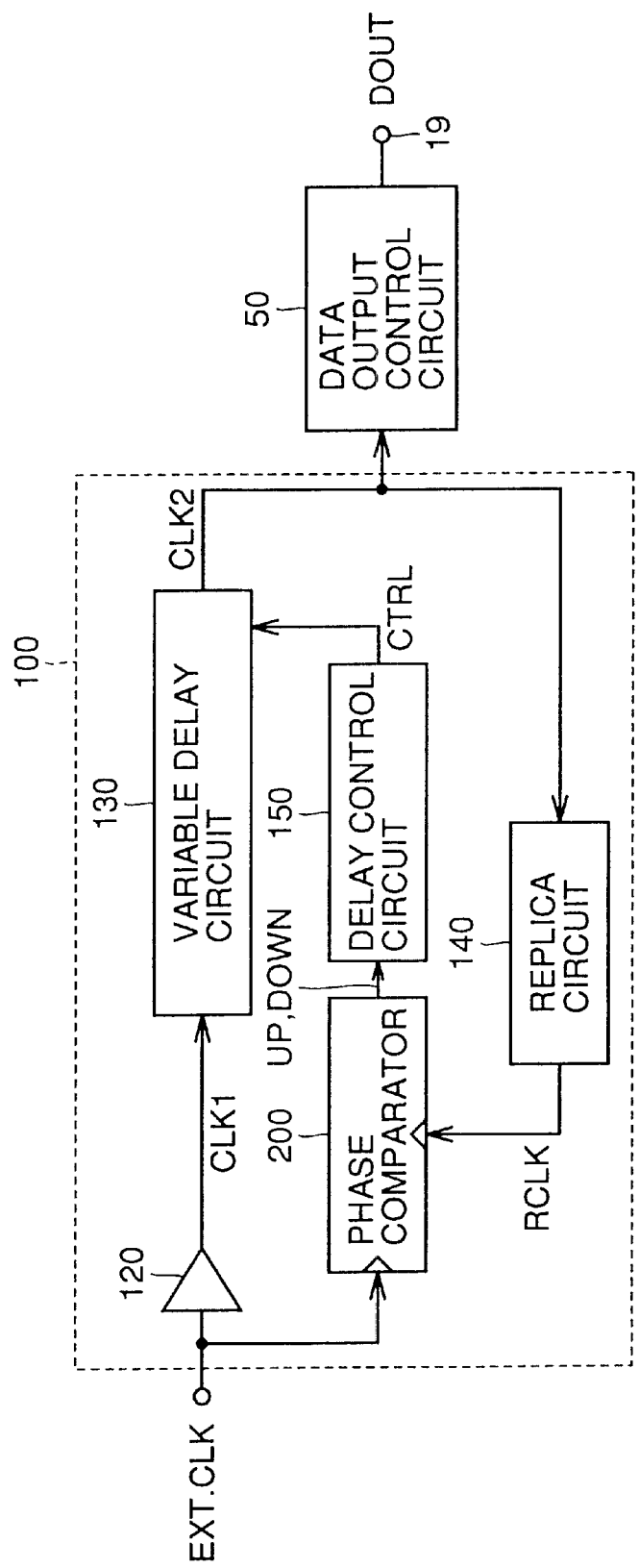
FIG. 2 is a block diagram showing a structure of a clock generation circuit 100 according to the first embodiment of the present invention.

Referring to FIG. 2, clock generation circuit 100 according to the first embodiment includes a clock input circuit 120, a variable delay circuit 130, a replica circuit 140, a phase comparator 200, and a delay control circuit 150.

Clock input circuit 120 generates an internal clock CLK1 according to external clock EXT.CLK. Variable delay circuit 130 delays internal clock CLK1 to generate an internal operation clock CLK2. Data output control circuit 50 responds to internal operation clock CLK2 to initiate a data output operation with respect to data output terminal 19. The delay generated at data output control circuit 50 is represented as tD2.

Replica circuit 140 delays internal operation clock CLK2 for a predetermined time to output a return clock RCLK. The delay amount of replica circuit 140 is designed to be equal to delay time tD2 generated at data output control circuit 50. Phase comparator 200 directly compares the phases of return clock RCLK and external clock EXT.CLK to generate control signals UP and DOWN to designate increase and decrease of the delay amount of variable circuit 130 according to the phase comparison result.

Delay control circuit 150 alters the value of delay control signal CTRL controlling the delay amount of variable delay circuit 130 according to control signals UP and DOWN. In the case where variable delay circuit 130 has a structure setting the amount of delay digitally, delay control signal CTRL is a digital signal of a plurality of bits to designate the amount of delay. In the case where variable delay circuit 130 has a structure setting the amount of delay in an analog manner, delay control signal CTRL is an analog signal having a potential level to designate the amount of delay. Variable delay circuit 130 sets the delay amount according to control delay signal CTRL.

According to the above-described structure, return clock RCLK does not have to pass through the replica circuit that compensates for delay caused at clock input circuit 120 since the phase of return clock RCLK is directly compared with the phase of external clock EXT.CLK. Therefore, access time tAC of the semiconductor memory device can maintain a stable value impervious to variation in the delay amount at the clock input circuit caused by variation in the external clock waveform, power supply voltage, power supply noise, temperature condition, process, and the like at the replica circuit to compensate for the delay caused in the clock input terminal. Thus, access time can be maintained at a stable value.

It is to be noted that in the structure of directly applying return clock RCLK to the phase comparator shown in FIG. 2, the input to phase comparator may be a control signal that has the signal level varied at a timing in response to a status transition timing of the return clock (in the following, control signal RC is the generic of control signals originating from return clock RCLK), instead of return clock RC itself.

Second Embodiment

Figure 3:
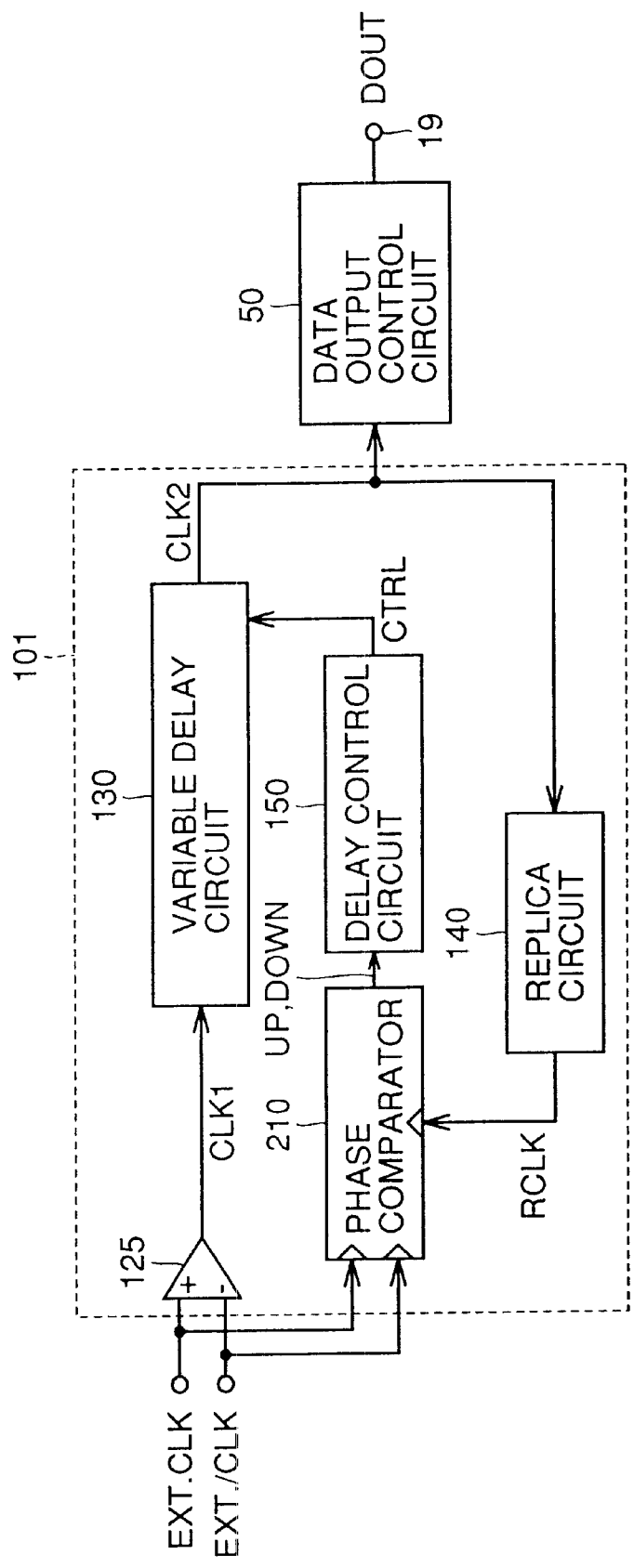
FIG. 3 is a block diagram showing a structure of a dock generation circuit 101 according to a second embodiment of the present invention.

Referring to FIG. 3, a clock generation circuit 101 according to a second embodiment of the present invention receives external clocks EXT.CLK and EXT./CLK complementary to each other to generate an internal operation clock CLK2. Clock generation circuit 101 includes a clock input circuit 125, a variable delay circuit 130, a replica circuit 140, a phase comparator 210 and a delay control circuit 150.

Clock input circuit 125 receives external clocks EXT.CLK and EXT./CLK complementary to each other to generate an internal clock CLK1 according to difference in the potential levels therebetween. Variable delay circuit 130 delays internal clock CLK1 to generate an internal operation clock CLK2. Replica circuit 140 further delays internal operation clock CLK2 for a predetermined time corresponding to delay tD2 generated at data output control circuit 50 to generate return clock RCLK, as in the case of FIG. 1.

Phase comparator 210 receives external clocks EXT.CLK and EXT./CLK complementary to each other and return clock RCLK to directly compare the phase where potential levels of external clocks EXT.CLK and EXT./CLK cross with the phase (status transition timing) of return clock RCLK, whereby control signals UP and DOWN are generated according to the phase comparison result. It is to be noted that control signal RC can be input to phase comparator 210 instead of return clock RCLK.

Delay control circuit 150 alters delay control signal CTRL according to control signals UP and DOWN. Variable delay circuit 130 adjusts the delay amount according to delay control signal CTRL. Control signals UP, DOWN and delay control signal CTRL are similar to those described already with reference to FIG. 1, so that detailed description thereof will not be repeated.

Figure 4:
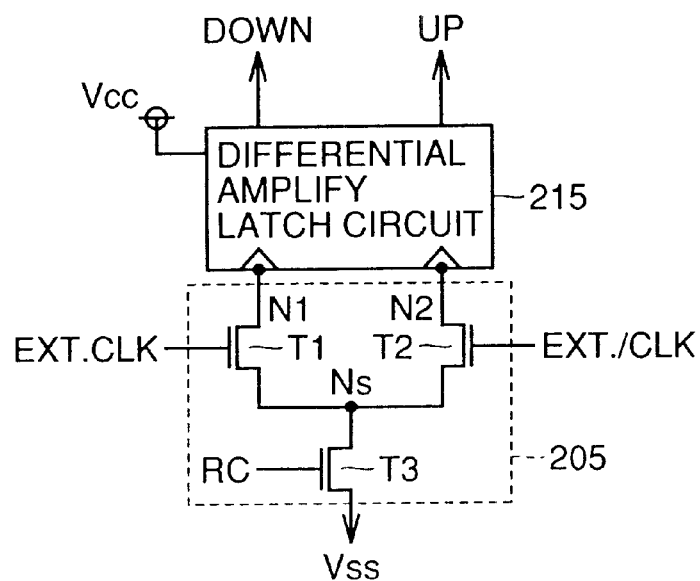
FIG. 4 is a block diagram showing an example of a structure of a phase comparator 210.

Referring to FIG. 4, phase comparator 210 includes a differential amplify latch circuit 215 amplifying and latching the potential difference of nodes N1 and N2, and a potential level difference conversion circuit 205 converting the potential level difference of external clocks EXT.CLK and EXT./CLK complementary to each other into the potential level difference of nodes N1 and N2.

Potential level difference conversion circuit 205 includes an N type MOS transistor T1 electrically coupled between nodes N1 and Ns, an N type MOS transistor T2 electrically coupled between nodes N2 and Ns, and an N type MOS transistor T3 electrically coupled between node Ns and ground voltage Vss. External clocks EXT.CLK and EXT./CLK complementary to each other are applied to the gates of transistors T1 and T2, respectively. Control signal RC is applied to the gate of transistor T3. A current path is formed between nodes N1-Ns and between nodes N2-Ns with control signal RC as a trigger in response to return clock RCLK. The potential level difference between external clocks EXT.CLK and EXT./CLK complementary to each other are output to nodes N1 and N2.

Differential amplify latch circuit 215 amplifies and latches the potential difference of nodes N1 and N2. The information latched in differential amplify latch circuit 215 is reflected in control signals UP and DOWN.

By directly receiving external clocks EXT.CLK and EXT./CLK complementary to each other at the differential gates and trigger differential amplification by a control signal RC responsive to the return clock, the potential level difference between external clocks EXT.CLK and EXT./CLK complementary to each other can be amplified at the status transition (activation) timing of control signal RC from an L level to an H level to be provided to nodes N1 and N2. Thus, the determination result of whether the activation timing of control signal RC is earlier or later than the timing where the potential levels of external clocks EXT.CLK and EXT./CLK complementary to each other cross can be reflected in control signals UP and DOWN to be output.

Figure 5:
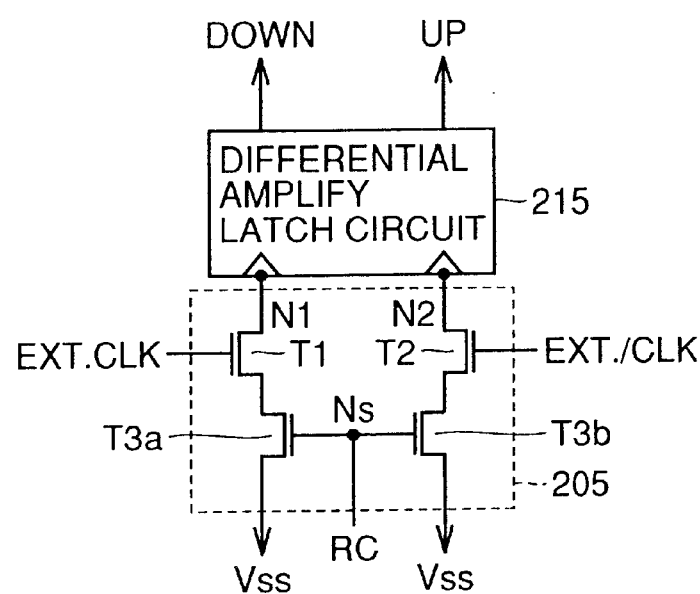
FIG. 5 is a block diagram showing another example of a structure of phase comparator 210.

Referring to FIG. 5, phase comparator 210 includes a differential amplify latch circuit 215 and a potential level difference conversion circuit 205, similar to that of FIG. 4.

Potential difference level conversion circuit 205 differs from the circuit shown in FIG. 4 in that N type MOS transistors T3a and T3b are provided between respective N type MOS transistors T1 and T2 and the ground potential Vss. A control signal RC related to return clock RCLK is applied in common to the gates of transistors T3a and T3b.

By the above-described structure, the potential level difference between complementary external clocks EXT.CLK and EXT./CLK is output to nodes N1 and N2 with control signal RC related to the return clock as a trigger. Therefore, similar to the structure shown in FIG. 4, determination of whether the activation timing of control signal RC is earlier than or later than the timing where the potential levels of complementary external clocks EXT.CLK and EXT./CLK cross can be output as control signals UP and DOWN.

By the above-described structure, clock generation circuit 101 can eliminate variation in the amount of delay in clock input circuit 125 caused by variation in the external clock waveform, the power supply voltage, the power supply noise, the temperature condition and the process, and in the replica circuit to compensate for delay caused at clock input circuit 125 from affecting access time tAC. As a result, access time tAC of the semiconductor memory device can be maintained stably using an internal operation clock that ensures a proper lock status of small phase error between the phases of the return clock RCLK and the complementary external clock.

Third Embodiment

Figure 6:
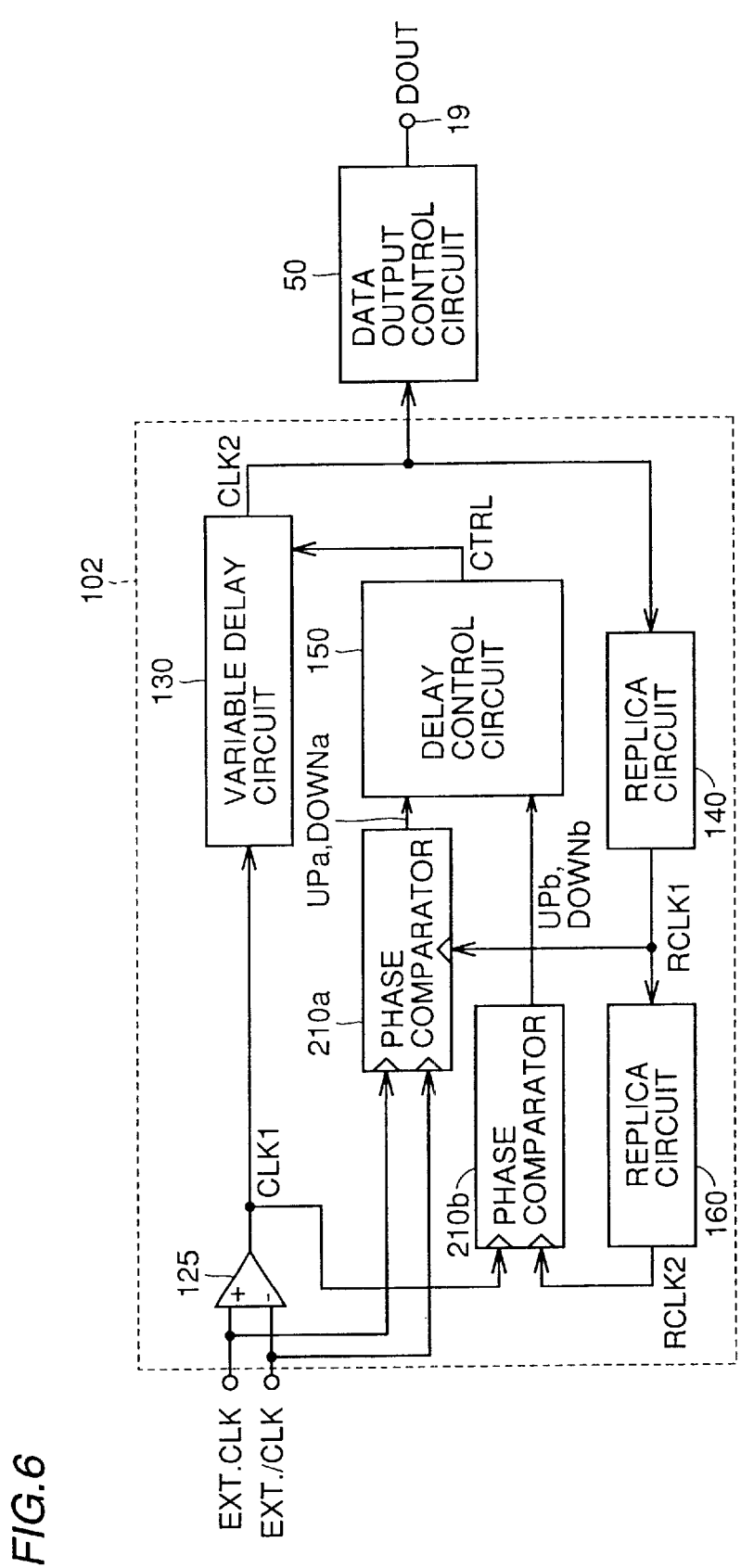
FIG. 6 is a block diagram showing a structure of a clock generation circuit 102 according to a third embodiment of the present invention.

Referring to FIG. 6, a clock generation circuit 102 according to a third embodiment of the present invention receives complementary external clocks EXT.CLK and EXT./CLK to generate an internal operation clock CLK2 that becomes the trigger signal of data output. Clock generation circuit 102 differs from clock generation circuit 101 of FIG. 3 in that two phase comparators are provided.

Clock generation circuit 102 includes a clock input circuit 125, a variable delay circuit 130, a replica circuit 140, a phase comparator 210a and a delay control circuit 150 forming a DLL similar to clock generation circuit 100 of FIG. 2. The structure and operation of this DLL are similar to those already described. Therefore, description thereof will not be repeated.

Clock generation circuit 102 further includes a replica circuit 160 that further delays return clock RCLK1 output from replica circuit 140 to generate a return clock RCLK2, and a phase comparator 2 10b comparing the phases between internal clock CLK1 and return clock RCLK2.

The amount of delay of replica circuit 160 is set corresponding to delay amount tD1 of clock input circuit 125. Phase comparator 210b compares the phase of internal clock CLK1 with the phase of return clock RCLK2 to generate control signals UPb and DOWNb to designate increase and decrease of the delay amount of variable delay circuit 130 according to the phase comparison result.

Similar to phase comparator 210 shown in FIG. 3, phase comparator 210a directly compares the phase where the potential levels of complementary external clocks EXT.CLK and EXT./CLK cross with the phase of return clock RCLK1 output from replica circuit 140 to generate control signals UPa and DOWNa according to the comparison result.

Delay control circuit 150 alters delay control signal CTRL according to signal UPb and signal DOWNb generated by phase comparator 210b. The delay amount of variable delay circuit 130 is adjusted according to control signal CTRL.

Then, the delay amount of variable delay circuit 130 is further adjusted to higher accuracy according to signal UPa and signal DOWNa generated by phase comparator 210a.

Since the coarse delay adjustment by phase comparator 210b and the fine delay adjustment by phase comparator 210a can be carried out corresponding to one cycle of the external clock, the advantage of directly executing phase comparison with the external clock by a phase comparator can be enjoyed while reducing the time required to attain the lock status to speed up phase adjustment. Furthermore, since the clock edge (rising edge/falling edge) to be matched in phase will not be mistaken, the lockable frequency range can be set wider.

Although a structure of directly applying return clocks RCLK1 and RCLK2 output from replica circuits to phase comparators 210a and 210b is shown in FIG. 6, the input to phase comparators 210a and 210b is not limited to return clocks RCLK1 and RCLK2. A control signal whose signal level changes at a timing in response to the status transition timing of these return clocks may be used.

Fourth Embodiment

Figure 7:
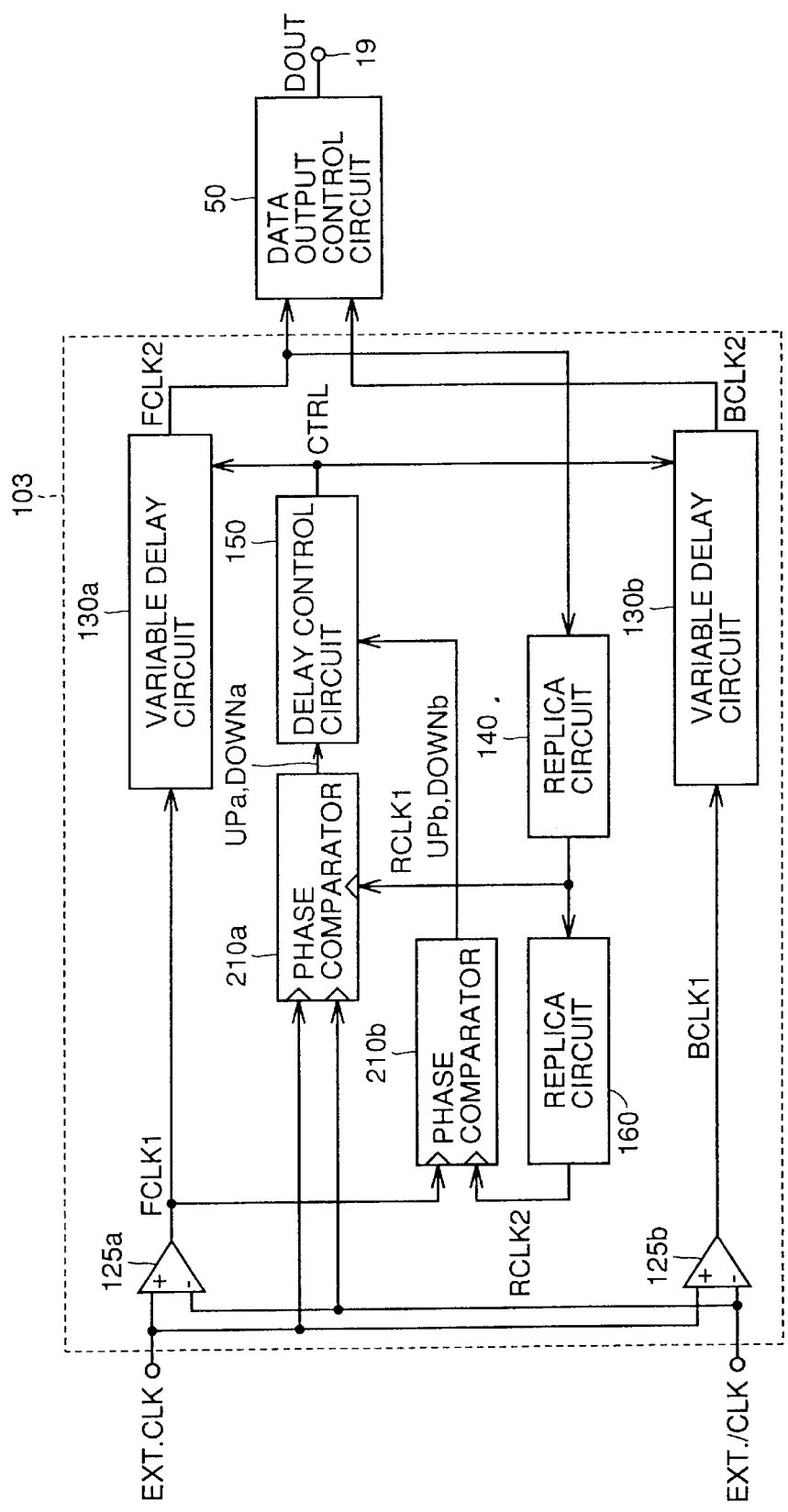
FIG. 7 is a block diagram showing a structure of a clock generation circuit 103 according to a fourth embodiment of the present invention.
Figure 25:
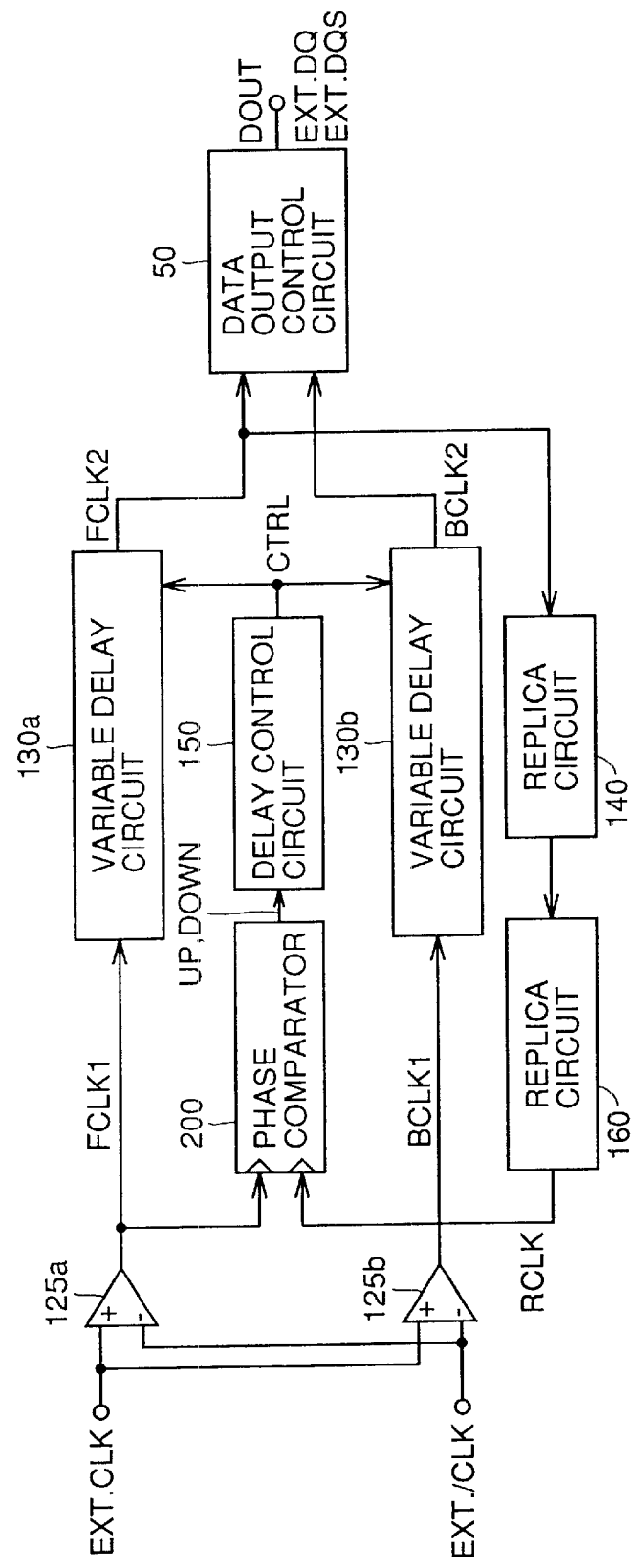
FIG. 25 is a block diagram showing a structure of another conventional clock generation circuit employed in a DDR-SDRAM.
Figure 26A:
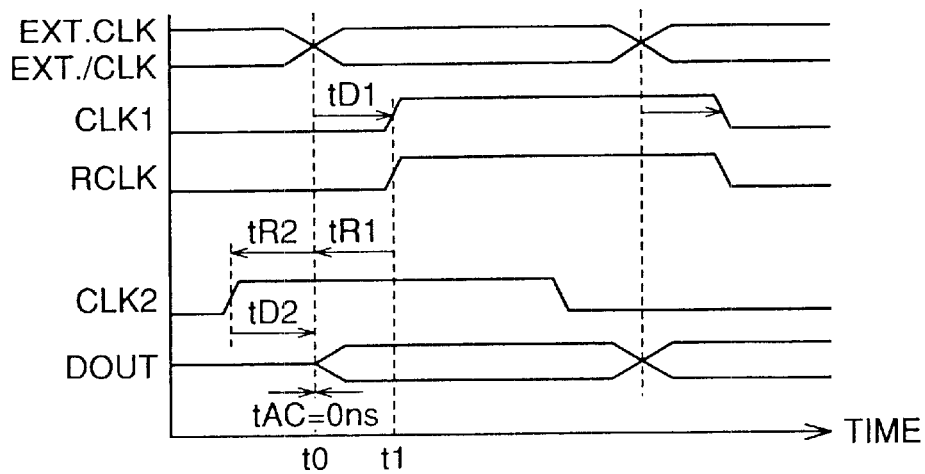
FIGS. 26A–26C are first to third timing charts, respectively, representing an operation of the conventional clock generation circuit shown in FIG. 24.
Figure 26B:
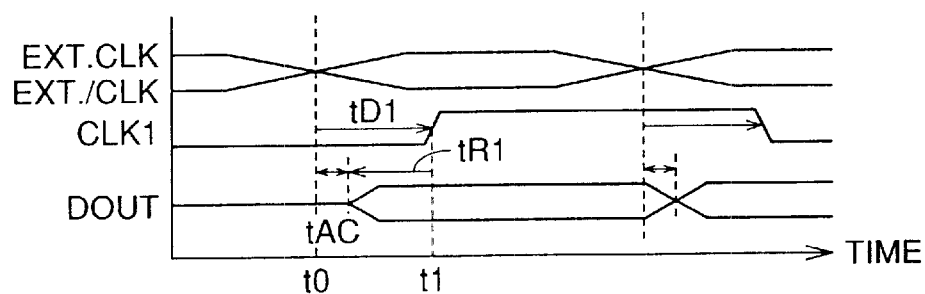
Figure 26C:
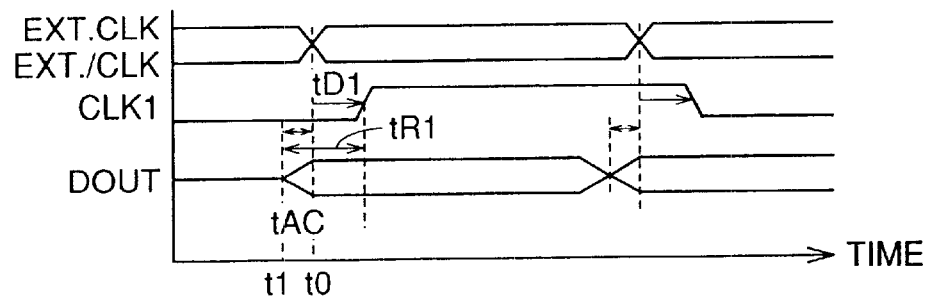

Referring to FIG. 7, a clock generation circuit 103 according to a fourth embodiment of the present invention is directed to improve the problem of the clock generation circuit shown in FIG. 25. Clock generation circuit 103 of the fourth embodiment has a dual delay line structure including variable delay circuits 130a and 130b.

Referring to FIG. 7, clock generation circuit 103 differs from clock generation circuit 102 of FIG. 6 in that a clock input circuit 125b to generate an internal clock BCLK1 in response to a falling edge of external clock EXT.CLK, and a variable delay circuit 130b delaying internal clock BCLK1 from clock input circuit 125b to generate an internal operation clock BCLK2 are provided. Clock input circuit 125a and variable delay circuit 130a correspond to clock input circuit 125 and variable delay circuit 130 in clock generation circuit 102. The structure and operation of the DLL formed of clock input circuit 125a, variable delay circuit 130a, replica circuits 140 and 160, and phase comparators 210a and 210b are similar to those of clock generation circuit 102. Therefore, description thereof will not be repeated.

The delay amount of variable delay circuit 130b is set to a value identical to that of variable delay circuit 130a according to delay control signal CTRL. Data output control circuit 50 responds to internal operation clocks FCLK2 and BCLK2 to output data DOUT to data output terminal 19. Data output control circuit 50 responds to both the rising edge and falling edge of external clock EXT.CLK to execute data output at the so-called double data rate.

Similar to clock generation circuit 102 of FIG. 6, clock generation circuit 103 can reduce the time required for delay adjustment of variable delay circuits 130a and 130b before a lock state is achieved to speed up phase adjustment. The DLL to match the phase is provided with respect to only internal clock FCLK1 responsive to the rising edge of external clock EXT.CLK. The delay amount of variable delay circuit 130b provided corresponding to internal clock BCLK1 generated in response to the falling edge of external clock EXT.CLK is set to a value identical to that of variable delay circuit 130a. Therefore, a stable lock status can be achieved. Also, each interval of the activation timing of internal operation clocks FCLK2 and BCLK2 can be set equal.

Fifth Embodiment

Figure 8:
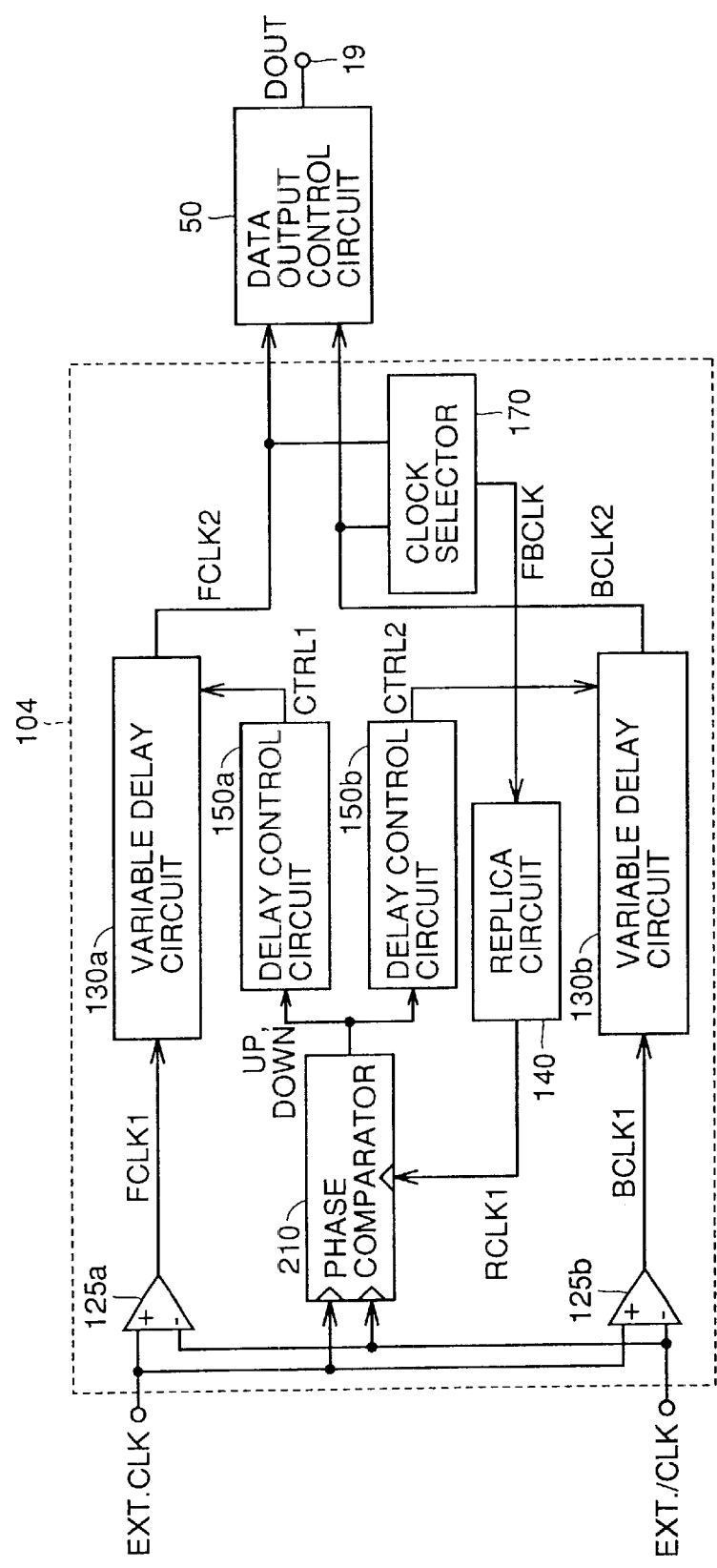
FIG. 8 is a block diagram showing a structure of a clock generation circuit 104 according to a fifth embodiment of the present invention.

Referring to FIG. 8, a clock generation circuit 104 according to a fifth embodiment of the present invention includes, in addition to the structure of clock generation circuit 101 of FIG. 3, a clock input circuit 125b generating an internal clock BCLK1 in response to a falling edge of external clock EXT.CLK, a variable delay circuit 130b delaying internal clock BCLK1 to generate an internal operation clock BCLK2, a clock selector 170 selecting either internal operation clock FCLK2 or BCLK2 to output the selected clock as a feedback clock FBCLK, and a delay control circuit 150b adjusting the delay amount of variable delay circuit 130b according to the phase comparison result of phase comparator 210. Replica circuit 140 delays feedback clock FBCLK from clock selector 170 to provide return clock RCLK1 to phase comparator 210.

Clock input circuit 125a, variable delay circuit 130a and delay control circuit 150a correspond to clock input circuit 125, variable delay circuit 130 and delay control circuit 150 in clock generation circuit 101, respectively. Therefore, the structure and operation thereof will not be repeated.

Clock selector 170 receives internal operation clocks FCLK2 and BCLK2 to send either clock to replica circuit 140 as feedback clock FBCLK. The select cycle of the internal operation clock by clock selector 170 may be set to alternately select internal operation clocks FCLK2 and BCLK by 1:1 or the select ratio of internal operation clocks FCLK2 and BCLK2 may be n:1 or 1:n (n is a natural number of at least 2). Here, it is required that the rising edges of respective internal operation clocks FCLK2 and BCLK2 are reflected in a mixed manner with respect to return clock RCLK1.

Replica circuit 140 delays the selected feedback clock FBCLK to generate a return clock RCLK1. Therefore, there is a mixture of a return clock RCLK1 that is referenced to the phase of internal operation clock BCLK2 and that is referenced to the phase of internal operation clock BCLK2.

Phase comparator 210 directly compares the phase where the potential levels of complementary external clocks EXT.CLK and EXT./CLK cross with the phase of return clock RCLK1 to generate control signals UP and DOWN according to the phase comparison result, similar to clock generation circuit 101. Therefore, control signals UP and DOWN are output with the mixture of the phase comparison result based on internal operation clock FCLK2 and the phase comparison result based on internal operation clock BCLK2.

Delay control circuits 150a and 150b generate delay control signals CTRL1 and CTRL2 to control the delay amount of variable delay circuits 150a and 150b, respectively, according to control signals UP and DOWN. Since delay control signals CTRL1 and CTRL2 corresponding to variable delay circuits 130a and 130b, respectively, are set independently, the delay amount of variable delay circuits 130a and 130b can differ from each other.

It is therefore possible to adjust independently the phases of two internal operation trigger signals generated in response to the falling edge and rising edge of external clock EXT.CLK. Thus, the skew between complementary external clocks EXT.CLK and EXT./CLK can be adjusted independently to allow a more accurate phasing.

Sixth Embodiment

Figure 9:
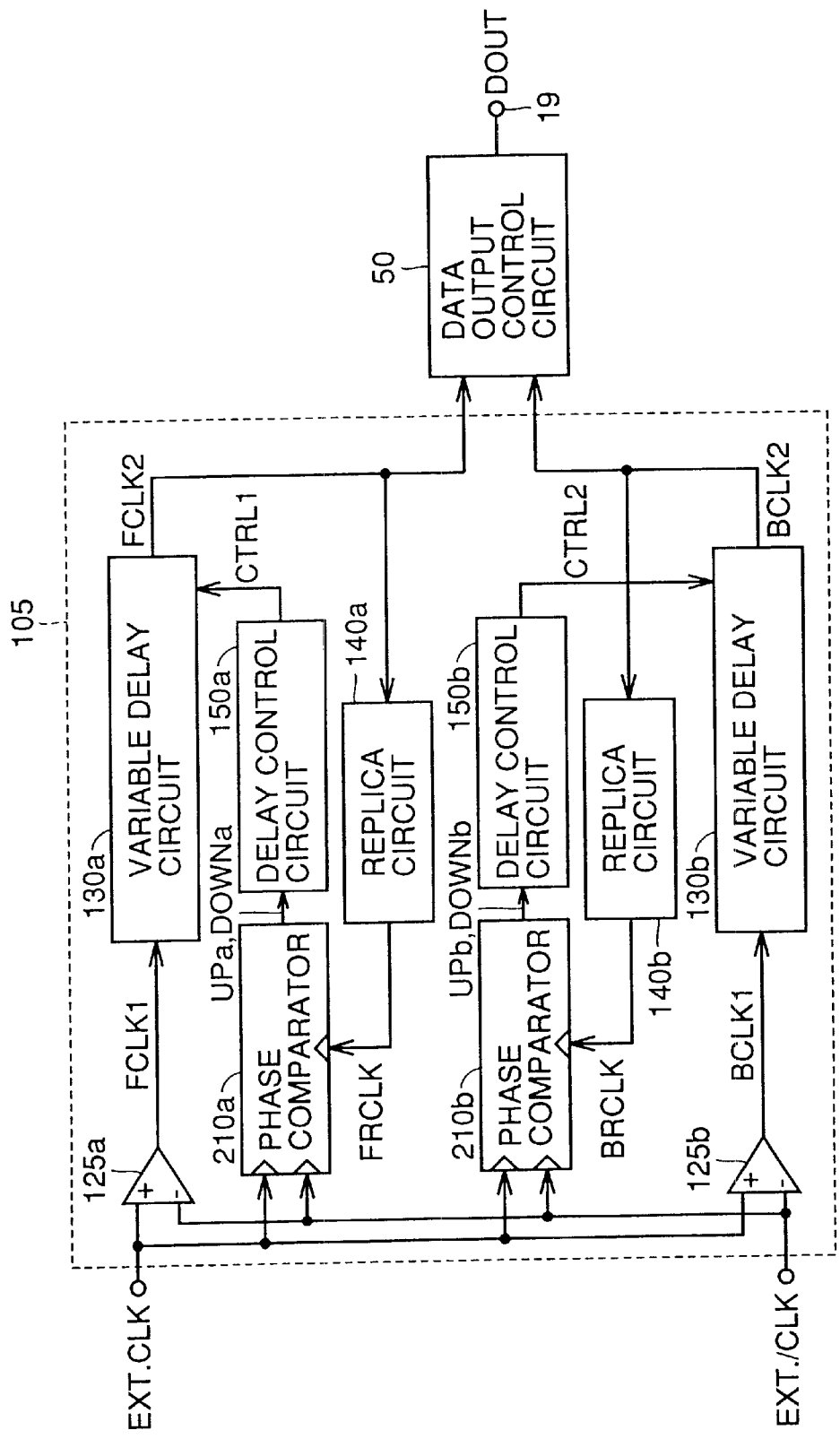
FIG. 9 is a block diagram showing a structure of a clock generation circuit 105 according to a sixth embodiment of the present invention.

Referring to FIG. 9, a clock generation circuit 105 according to a sixth embodiment of the present invention differs from clock generation circuit 104 of FIG. 8 in that clock selector 170 is not provided and that a DLL structure is provided corresponding to each of internal clocks FCLK1 and BCLK1 responsive to the rising and falling edges of external clock EXT.CLK.

Clock generation circuit 105 includes a clock input circuit 125a generating internal clock FCLK1 in response to a rising edge of external clock EXT.CLK, as well as a variable delay circuit 130a, a replica circuit 140a, a phase comparator 210a and a delay control circuit 150a forming a DLL for internal clock FCLK1.

Clock generation circuit 105 further includes a clock input circuit 125b generating an internal clock BCLK1 in response to the falling edge of external clock EXT.CLK, as well as a variable delay circuit 130b, a replica circuit 140b, a phase comparator 210b and a delay control circuit 150b forming a DLL for an internal clock BCLK1.

The structure and operation of each DLL is similar to those of the DLL formed of variable delay circuit 130, replica circuit 140, phase comparator 210 and delay control circuit 150 in clock generation circuit 101 of FIG. 3. Therefore, detailed description thereof will not be repeated.

Phase comparators 210a and 210b directly compare the phase of respective corresponding internal clocks with the phase where the potential levels of complementary external clocks EXT.CLK and EXT./CLK cross.

The delay amount adjustment of each DLL is executed independently. Delay control circuit 150a generates a delay control signal CTRL1 to set the delay amount of variable delay circuit 130a according to control signals UPa and DOWNa based on the phase comparison result of phase comparator 210a. Similarly, delay control circuit 150b generates a delay control signal CTRL2 to set the delay amount of variable delay circuit 130b according to control signals UPb and DOWNb based on the phase comparison result of phase comparator 210b.

Similar to clock generation circuit 104 of the fifth embodiment, since the skew between complementary external clocks EXT.CLK and EXT./CLK can be adjusted independently, a more accurate phasing is allowed. Furthermore, since clock generation circuit 105 does not have to select an internal operation clock by clock selector 170 as shown in FIG. 8, control can be simplified.

Seventh Embodiment

Figure 10:
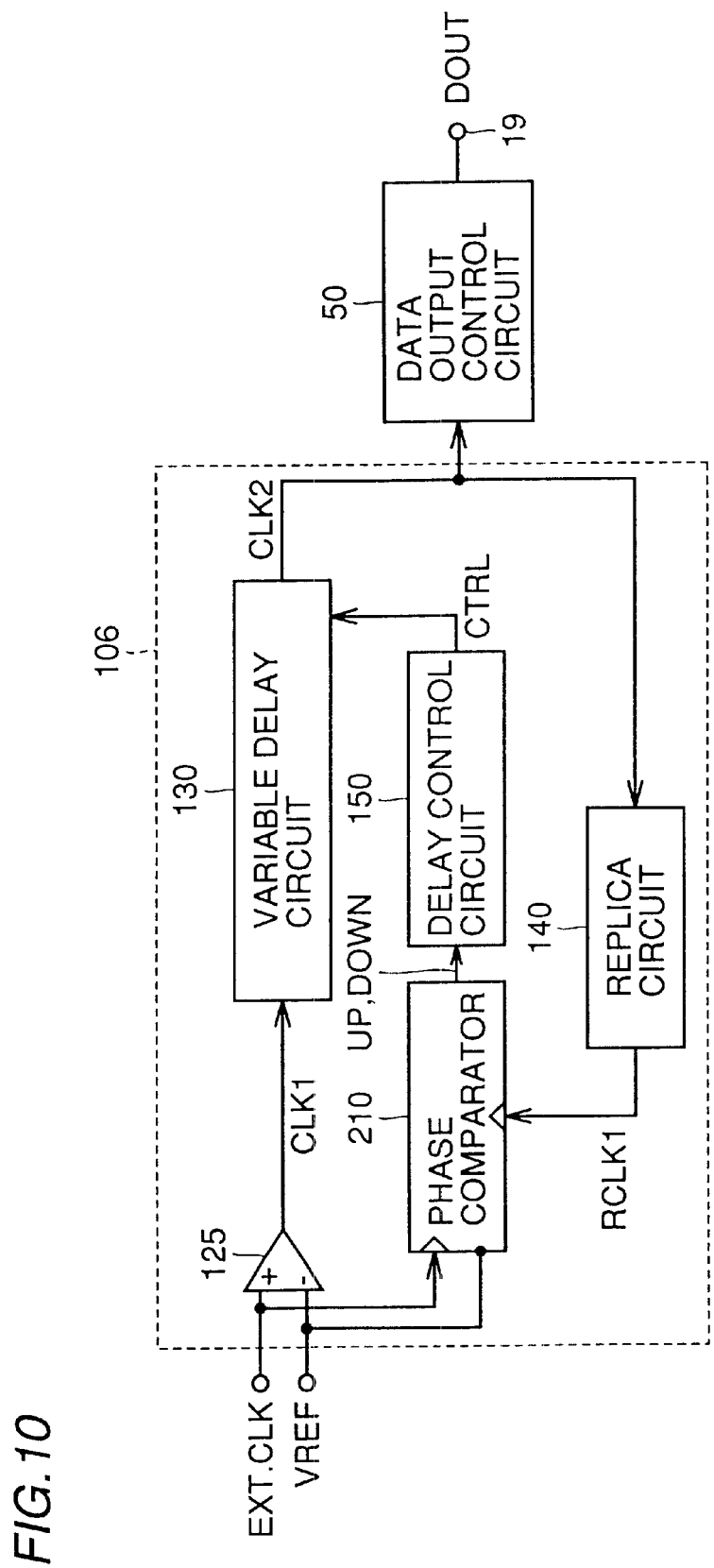
FIG. 10 is a block diagram showing a structure of a clock generation circuit 106 according to a seventh embodiment of the present invention.

Referring to FIG. 10, a clock generation circuit 106 according to a seventh embodiment of the present invention has a structure similar to that of clock generation circuit 101 shown in FIG. 3, provided that the inputs of clock input circuit 125 are a single external clock EXT.CLK and a reference voltage VREF to define the reception timing of the external clock, instead of complementary external clocks EXT.CLK and EXT./CLK. The remaining structure and operation of clock generation circuit 106 are similar to those of clock generation circuit 101. Therefore, detailed description thereof will not be repeated.

Clock generation circuit 106 applies clock generation circuit 101 of the second embodiment corresponding to a single external clock that is not a complementary clock. Clock input circuit 125 receives external clock EXT.CLK to generate an internal clock CLK1 according to the relationship of the potential level between external clock EXT.CLK and reference voltage VREF. Reference voltage VREF is a signal having a direct current potential, and can be supplied from an external source or generated inside the semiconductor memory device.

By the above-described structure, an advantage similar to that of clock generation circuit 101 can be enjoyed even if the external clock is a single clock instead of complementary clocks. Also, by setting the inputs of clock input circuit 125 to external clock EXT.CLK and reference voltage VREF also for clock generation circuit 102 shown in FIG. 6, a similar advantage can be enjoyed even when the external clock is a single clock.

Eighth Embodiment

Figure 11:
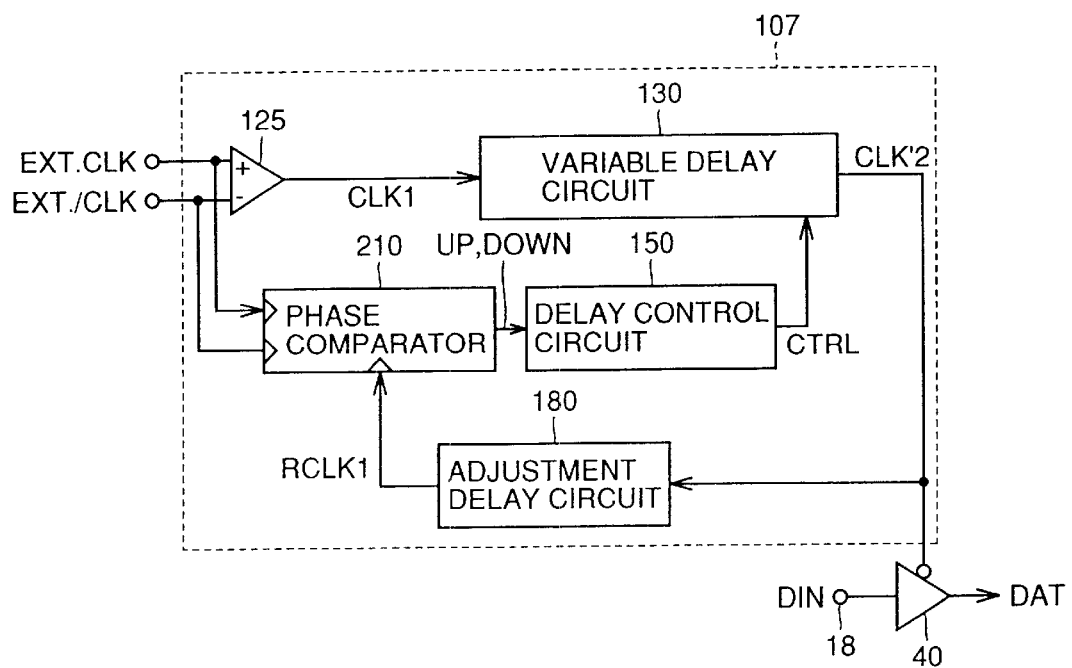
FIG. 11 is a circuit diagram showing a structure of a clock generation circuit 107 according to an eighth embodiment of the present invention.

Referring to FIG. 11, a clock generation circuit 107 according to an eighth embodiment of the present invention receives complementary external clocks EXT.CLK and EXT./CLK to generate an internal operation clock CLK'2 that is the operation trigger for data input latch circuit 40. Data input latch circuit 40 responds to internal operation clock CLK'2 to latch input data DIN applied to data input terminal 18.

Referring to FIG. 11, clock generation circuit 107 includes a clock input circuit 125 generating an internal clock CLK1 according to the potential level difference between complementary external clocks EXT.CLK and EXT./CLK, a variable delay circuit 130 delaying input clock CLK1 to generate internal operation clock CLK'2, an adjustment delay circuit 180 delaying internal operation clock CLK'2 to output a return clock RCLK1, a phase comparator 210 receiving complementary external clocks EXT.CLK and EXT./CLK and return clock RCLK1 to generate control signals UP and DOWN, and a delay control circuit 150 generating a delay control signal CTRL to set the delay amount of variable delay circuit 130 according to the phase comparison result of phase comparator 210.

Adjustment delay circuit 180 is provided taking into account the delay that is required to adjust the input timing of data. Therefore, this delay may not be particularly required depending upon the specification of the semiconductor memory device. In this case, adjustment delay circuit 180 is omitted.

Phase comparator 210 directly compares the phase of return clock RCLK1 with the phase where the potential levels of complementary external clocks EXT.CLK and EXT./CLK cross to generate control signals UP and DOWN reflecting the phase comparison result. Delay control circuit 150 generates a delay control signal CTRL according to control signals UP and DOWN. Variable delay circuit 130 adjusts the amount of delay according to delay control signal CTRL.

In clock generation circuit 107, the input of phase comparator 210 does not have to be return clock RCLK itself, and a control signal RC whose signal level changes at the timing in response to the status transition timing of the return clock can be input instead.

Clock generation circuit 107 has a structure similar to that of clock generation circuit 101 of the second embodiment. A proper lock status of small phase error can ensured by comparing the phase of the return clock directly with the phase of the external clock.

By operating data input latch circuit 40 in response to an internal operation clock generated by clock generation circuit 107, the data input timing of the semiconductor memory device is not affected by variation in the delay amount in clock input circuit 125 caused by variation in the external clock waveform, the power supply voltage, the power supply noise, the temperature condition, and the process, and in the replica circuit to compensate for delay caused by the clock input circuit. Therefore, data can be input stably.

Ninth Embodiment

The previous first to eighth embodiments correspond to the structure of a clock generation circuit employing a DLL structure. The ninth embodiment corresponds to a structure of a clock generation circuit employing a PLL structure.

Figure 12:
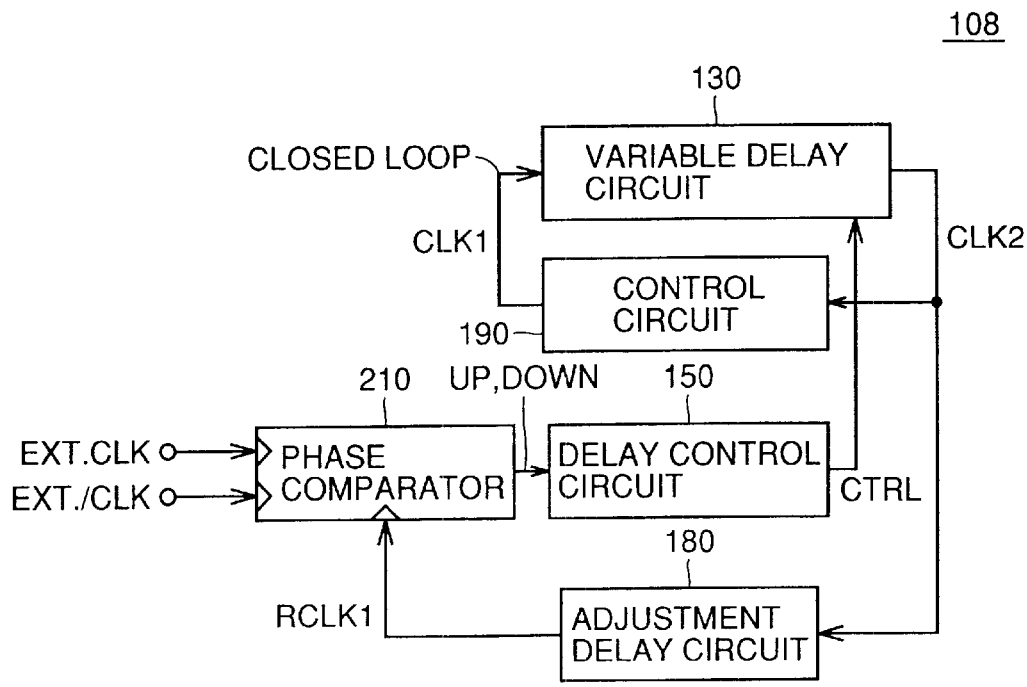
FIG. 12 is a block diagram showing a structure of a clock generation circuit 108 according to a ninth embodiment of the present invention.

Referring to FIG. 12, a clock generation circuit 108 according to a ninth embodiment of the present invention generates an internal operation clock CLK2 in response to complementary external clocks EXT.CLK and EXT./CLK.

Clock generation circuit 108 includes a control circuit 190 and a variable delay circuit 130 forming a closed loop to generate internal clock CLK1 and internal operation clock CLK2, respectively, an adjustment delay circuit 180 delaying internal operation clock CLK2 to generate return clock RCLK1, a phase comparator 210 receiving complementary external clocks EXT.CLK and EXT./CLK and return clock RCLK1 to carry out phase comparison, and a delay control circuit 150 generating a delay control signal CTRL to set the delay amount of variable delay circuit 130 according to the phase comparison result of phase comparator 210.

Variable delay circuit 130 delays internal clock CLK1 to generate internal operation clock CLK2. Internal operation clock CLK2 can be used as the control clock in the semiconductor memory device or as the trigger signal of the data input/output interface.

Adjustment delay circuit 180 delays internal operation clock CLK2 to output return clock RCLK1. The amount of delay set at adjustment delay circuit 180 is determined corresponding to the operation of the internal circuit to which internal operation clock CLK2 is supplied. Particularly in the case where delay is not required, adjustment delay circuit 180 can be omitted.

Phase comparator 210 directly compares the phase where potential levels of complementary external clocks EXT.CLK and EXT./CLK cross with the phase of return clock RCLK1 to generate control signals UP and DOWN reflecting the phase comparison result. Delay control circuit 150 alters a common control signal CTRL in response to control signals UP and DOWN to adjust the delay amount of variable delay circuit 130.

By providing a phase comparator that directly compares the phase between the internal return clock and the external clock, the affect of the variation of the delay amount in the clock input circuit caused by variation in the external clock waveform, the power supply voltage, the power supply noise, the temperature condition and the process, and also in the replica circuit to compensate for delay caused by the clock input circuit can be eliminated to ensure an accurate lock status of small phase error.

In dock generation circuit 108, input to phase comparator 210 is not limited to return clock RCLK1, and a control signal RC whose signal level is altered at the timing in response to the status transition timing of the return clock can be input instead.

Tenth Embodiment

The tenth embodiment is directed to variations of specific structures of a phase comparator directly comparing the phase of the internal return clock with the phase of the external clock.

The circuit diagram of phase comparator 210 according to a first structural example is a detailed representation of the circuit structure of the block diagram shown in FIG. 4.

Figure 13:
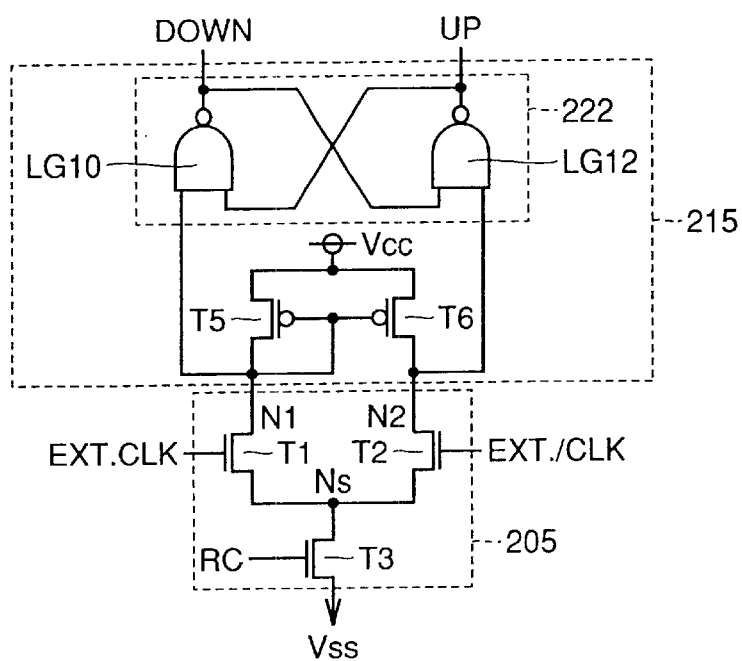
FIGS. 13, 14, 15 and 16 are circuit diagrams showing first, second, third, and fourth examples, respectively of a structure of a phase comparator 210.

Referring to FIG. 13, phase comparator 210 includes a differential amplify latch circuit 215 amplifying and latching the potential difference of nodes N1 and N2, and a potential level difference conversion circuit 205 converting the potential level difference between complementary external clocks EXT.CLK and EXT./CLK into the potential level difference of nodes N1 and N2. The structure of potential level difference conversion circuit 205 is similar to that shown in FIG. 4. Therefore, description thereof will not be repeated.

Differential amplifier latch circuit 215 includes logic gates LG10 and LG12 forming a flip flop 222, and P type MOS transistors T5 and T6 electrically coupled between power supply potential Vcc and respective nodes N1 and N2. Transistors T5 and T6 have their gates coupled to node N1. Transistors T1, T2, T5 and T6 form a current mirror amplify circuit that amplifies and provides to nodes N1 and N2 the potential level of difference between complementary clocks EXT.CLK and EXT./CLK.

The differential amplify operation of the current mirror amplify circuit formed of transistors T1, T2, T5 and T6 is executed with control signal RC as a trigger. The signal level of control signal RC changes at a timing in response to the status transition timing of the return clock. More specifically, in response to activation of control signal RC, transistor T3 turns on, whereby the operating current of the current mirror amplify circuit is supplied. The amplify operation of the potential level difference between complementary clocks EXT.CLK and EXT./CLK is initiated. The potential levels of nodes N1 and N2 are applied to flip flop 222 as a set input and a reset input, respectively.

According to the above-described structure, the potential levels of nodes N1 and N2 attain an L level (ground potential Vss) and an H level (power supply potential Vcc) respectively when the potential level of external clock EXT.CLK is already higher than inverted clock EXT./CLK, i.e. when the phase of the return clock is behind the phase of external clock at the activation time point of control signal RC that initiates an amplify operation. Therefore, control signal DOWN to reduce the delay amount of the variable delay circuit is rendered active.

In contract, when the potential level of inverted clock EXT./CLK is still higher than external clock EXT.CLK at the time of activation of control signal RC, the potential levels of nodes N1 and N2 attain an H level (power supply potential Vcc) and an L level (ground potential Vss) respectively. Therefore, control signal UP to increase the delay amount of the variable delay circuit is rendered active (H level).

Since control signals UP and DOWN are the outputs of a flip flop, the signal levels of control signals UP and DOWN are maintained until the phase relationship between external clock EXT.CLK and control signal RC (return clock) is inverted at the activation timing of control signal RC.

Using phase comparator 210 of the above-described structure, the phase of the external clock defining the timing where the potential levels of complementary external clocks EXT.CLK and EXT./CLK become equal can be compared with the phase of control signal RC, i.e., the return clock to reflect the phase comparison result in control signals UP and DOWN to be output.

Figure 14:
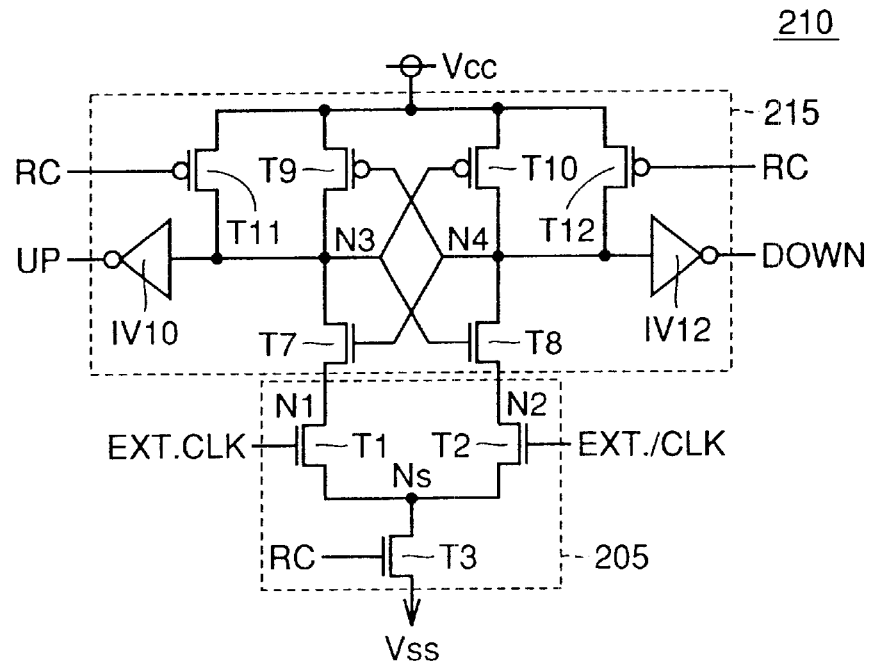

Referring to FIG. 14, phase comparator 210 according to a second structural example is a detailed representation of another circuit structure of the block diagram shown in FIG. 4.

Phase comparator 210 according to the second structural example includes a differential amplify latch circuit 215 amplifying and latching the potential difference of nodes N1 and N2, and a potential level difference conversion circuit 205 converting the potential level difference of complementary external clocks EXT.CLK and EXT./CLK into the potential level difference between nodes N1 and N2. Since the structure of potential level difference conversion circuit 205 is similar to that shown in FIG. 4, description thereof will not be repeated.

Differential amplify latch circuit 215 includes an N type MOS transistor T7 electrically coupled between nodes N3 and N1, an N type MOS transistor T8 electrically coupled between nodes N4 and N2, P type MOS transistors T9 and T10 coupled between power supply potential Vcc and respective nodes N3 and N4, and inverters IV10 and IV12 generating control signals UP and DOWN according to the potential levels of nodes N3 and N4. Transistors T7–T10 form a cross-coupled type amplifier.

Differential amplify latch circuit 215 further includes P type MOS transistors T11 and T12 to precharge nodes N3 and N4 to the level of power supply potential Vcc, respectively, during an inactivation period of control signal RC, i.e., during the period an operating current is not supplied to differential amplify latch circuit 215. Transistors T11 and T12 are electrically coupled between power supply potential Vcc and respective nodes N3 and N4 to receive control signal RC at their gates. Therefore, transistors T11 and T12 are turned on/off complementarily to transistor T3.

By the above-described structure, the potential levels of N3 and N4 are fixed to an H level (power supply potential Vcc) and control signals UP and DOWN are both rendered inactive (L level) prior to an operation of differential amplify latch circuit 215. At the activation (H level) timing of control signal RC, nodes N3 and N4 are disconnected from power supply potential Vcc, and transistor T3 is turned on, whereby operating current is supplied to differential amplify latch circuit 215.

In response, the potential difference between complementary external clocks EXT.CLK and EXT./CLK is converted into the potential difference of nodes N1 and N2, and then amplified to be latched at nodes N3 and N4. The relationship of the potential levels of complementary external clocks EXT.CLK and EXT./CLK and the relationship of the signal levels of control signals UP and DOWN indicating the phase comparison result are similar to those described with reference to FIG. 13. Therefore, description thereof will not be repeated.

Figure 15:
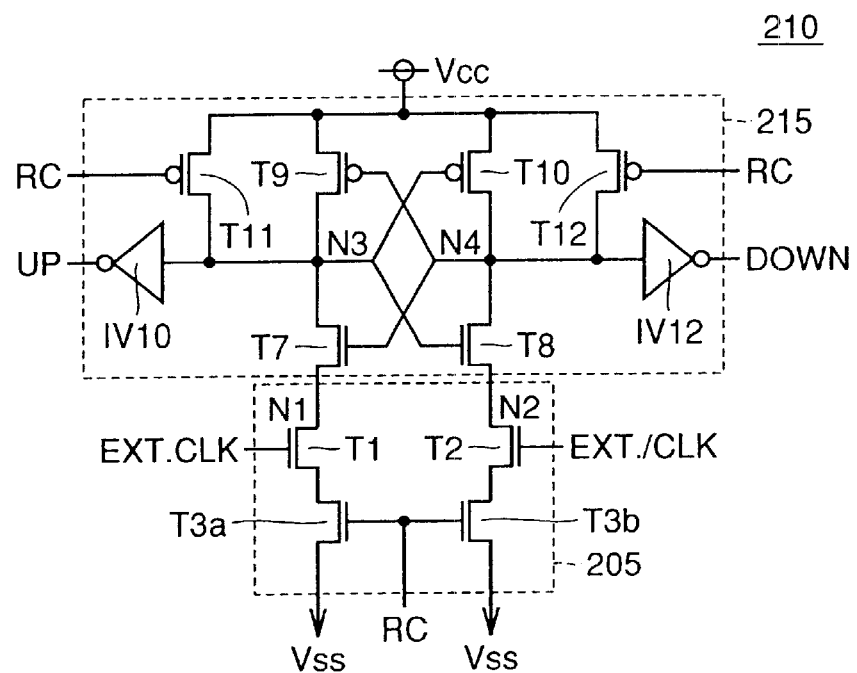

Referring to FIG. 15, a phase comparator 210 according to a third structural example has a structure similar to that shown in FIG. 14, provided that N type MOS transistors T3a and T3b are included instead of N type MOS transistor T3 to supply ground potential Vss to transistors T1 and T2.

A common control signal RC is applied to the gates of transistors T3a and T3b.

By such a structure, the supply of ground potential Vss to the sources of N type MOS transistors T1 and T2 can be executed by an independent transistor. The structure and operation of the remain components are similar to those of FIG. 3. Therefore, description thereof will not be repeated.

Figure 16:
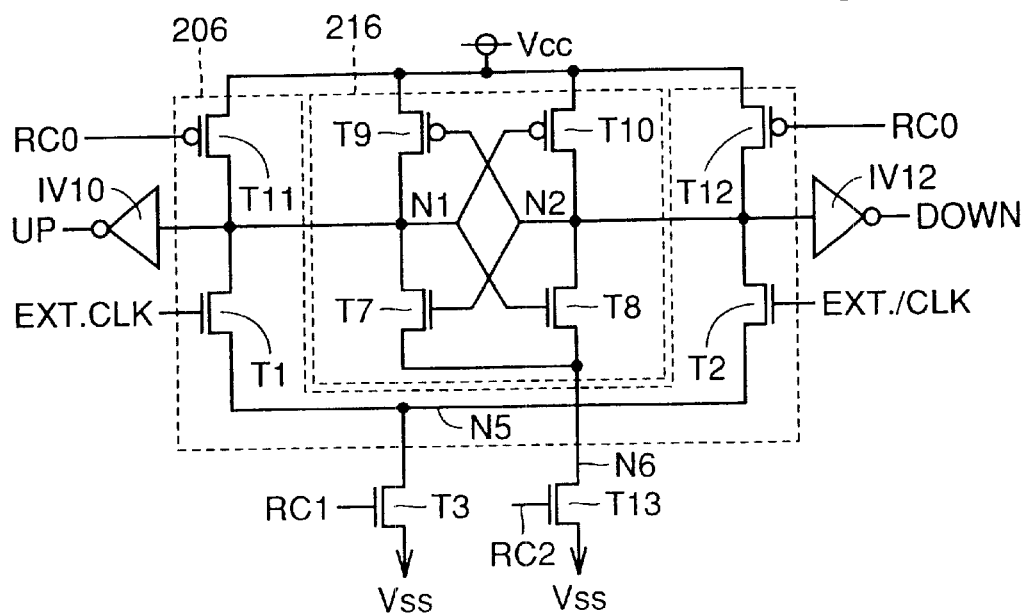

Referring to FIG. 16, phase comparator 210 according to a fourth structural example includes a potential level difference conversion circuit 206 operating in response to activation of control signal RC and converting the potential level difference of complementary external clocks EXT.CLK and EXT./CLK into the potential level difference of nodes N1 and N2, a differential amplify latch circuit 216 amplifying and latching the potential difference of nodes N1 and N2, an inverter IV10 generating a control signal UP according to the potential level of node N1, and an inverter IV12 generating a control signal DOWN according to the potential level of node N2.

Potential level difference conversion circuit 206 includes a P type MOS transistor T11 electrically coupled between node N1 and power supply potential Vcc, an N type MOS transistor T1 electrically coupled between nodes N5 and N1, a P type MOS transistor T12 electrically coupled between node N2 and power supply potential Vcc, and an N type MOS transistor T2 electrically coupled between nodes N5 and N2. Complementary external clocks EXT.CLK and EXT./CLK are applied to the gates of transistors T1 and T2. A control signal RC0 responsive to the return clock is applied in common to the gates of transistors T11 and T12.

Differential amplify latch circuit 216 includes N type MOS transistors T7 and T8 and P type MOS transistors T9 and T10 forming a cross-coupled type amplifier to amplify and latch the signal levels of nodes N1 and N2. Transistors T9 and T10 are electrically coupled between power supply potential Vcc and nodes N1 and N2, respectively. Transistors T7 and T8 are electrically coupled between node N6 and nodes N1 and N2, respectively. Transistors T7 and T9 have their gates electrically coupled to node N2. Transistors T8 and T10 have their gates electrically coupled to node N1.

Phase comparator 210 according to the fourth structural example further includes an N type MOS transistor T3 electrically coupled between node N5 and ground potential Vss to supply an operating current of potential level difference conversion circuit 206, and an N type MOS transistor T13 electrically coupled between node N6 and ground potential Vss to supply an operating current to differential amplify latch circuit 216. Control signals RC1 and RC2 are applied to the gates of transistors T3 and T13, respectively.

Figure 17:
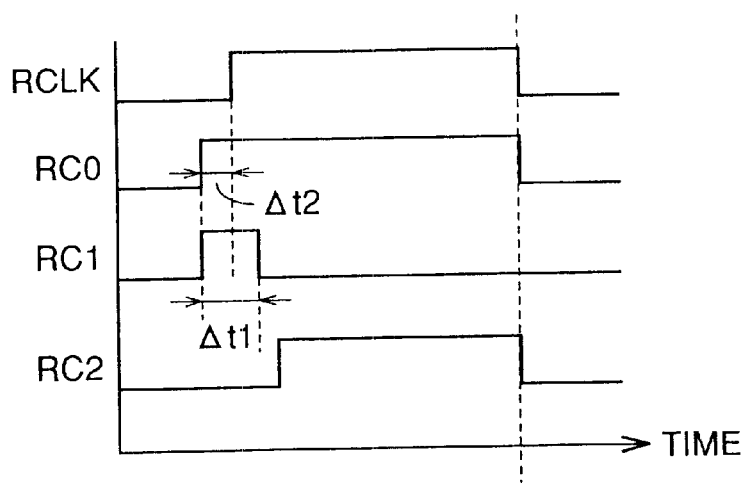
FIG. 17 is a timing chart to describe an activation timing of control signals RC0, RC1 and RC2.

FIG. 17 is a timing chart to describe an activation timing of control signals RC0, RC1 and RC2.

Referring to FIG. 17, the activation timings of control signals RC0–RC2 are determined corresponding to the activation timing of return clock RCLK.

Control signal RC0 is rendered active earlier than the activation (H level) timing of return clock RCLK by $\Delta t2$, and maintains an active state (H level) during activation of return clock RCLK. Control signal RC1 is rendered active (towards an H level) simultaneous to control signal RC0 to maintain an active state (H level) during a period $\Delta t1$, and then attains an inactive state (towards an L level) after return clock RCLK is rendered active (towards an H level). Control signal RC2 is rendered active (towards an H level) at a timing behind inactivation (towards an L level) of control signal RC1, and attains an inactive status (towards an L level) simultaneous to return clock signal RCLK.

Referring to FIG. 16 again, the potential levels of nodes N1 and N2 are precharged to an H level (power supply potential Vcc) during an inactive status (L level) of control signal RC0. In response, control signals UP and DOWN are both rendered inactive (L level).

Upon activation of control signal RC0, nodes N1 and N2 are disconnected from power supply potential Vcc. At the same time, control signal RC1 is rendered active (H level). Therefore, a current path is formed from node N1 (Vcc precharge)~transistor T1~transistor T3~ground potential Vss and from node N2 (Vcc precharge)~transistor T2~transistor T13~ground potential Vss. Therefore, the potential levels of complementary clocks EXT.CLK and EXT./CLK applied to respective gates of transistors T1 and T2 appear reflecting the potential level difference of nodes N1 and N2. The potential level difference between nodes N1 and N2 is amplified by transistors T7–T10.

Upon inactivation (towards an L level) of control signal RC1 and activation (towards an H level) of signal RC2, the amplified potential levels of nodes N1 and N2 are latched by the cross-coupled amplifier formed of transistors T7–T10. The relationship between the potential levels of nodes N1 and N2 and the signal levels of control signals UP and DOWN indicating the phase comparison result is similar to that described with reference to FIG. 13. Therefore, description thereof will not be repeated.

By such a structure, the amplify operation of the potential level difference between complementary external clocks EXT.CLK and EXT./CLK can be executed only during the period of Δt1 where control signal RC1 is rendered active. By setting the middle of the activation period (H level) of control signal RC1 to match the activation edge of return clock RCLK, the amplify operation of the potential level difference of complementary external clocks is executed only during a particular window period. Therefore, the phase of return clock RCLK can be compared in further accuracy with the phase of the external clock.

Figure 18:
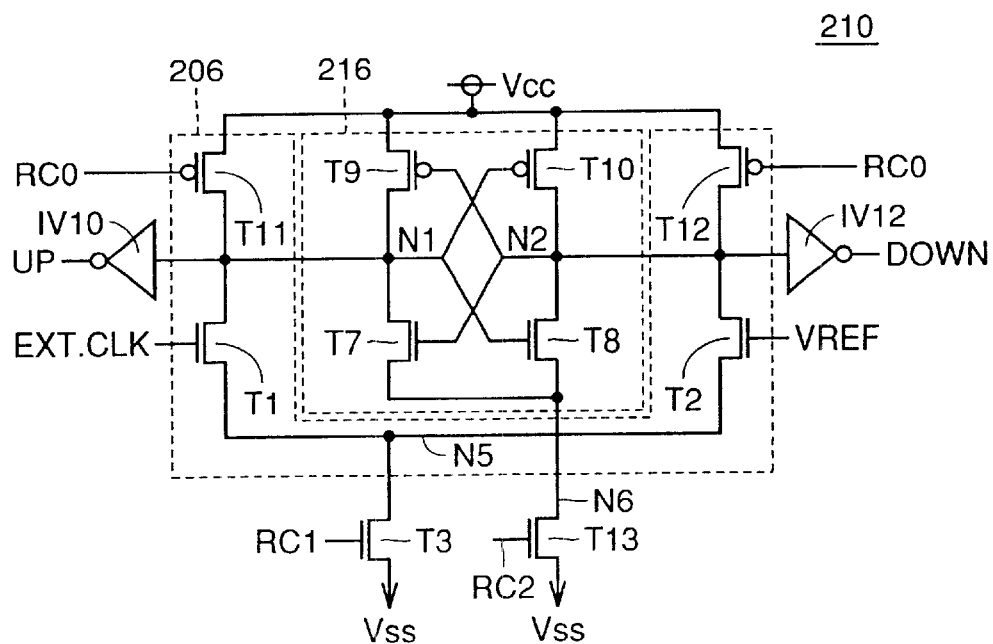
FIGS. 18 and 19 are circuit diagrams showing fifth and sixth examples, respectively, of a structure of phase comparator 210.

Referring to FIG. 18, phase comparator 210 according to a fifth structural example has a structure similar to that of the phase comparator shown in FIG. 16, provided that the signal applied to the gate of transistor T2 is a reference voltage VREF to receive a single external clock EXT.CLK instead of inverted clock EXT./CLK.

By such a structure, the potential level difference between external clock EXT.CLK and reference voltage VREF can be amplified to amplify and latch the amplified result during a particular period provided with the activation edge of return clock RCLK as the center. Therefore, phase comparison between return clock RCLK and external clock EXT.CLK can be executed correctly even when the external clock is a single clock instead of complementary clocks.

Figure 19:
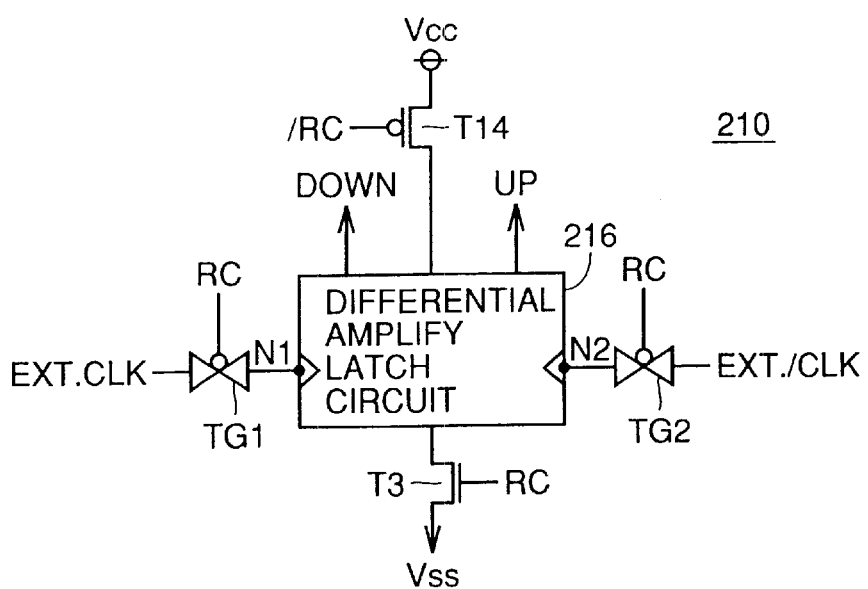

Referring to FIG. 19, phase comparator 210 according to a six structural example includes transistor gates TG1 and TG2 to transmit complementary clocks EXT.CLK and EXT./CLK to nodes N1 and N2, a differential amplify latch circuit 216 amplifying and latching the potential difference of nodes N1 and N2, and a P type MOS transistor T14 and an N type MOS transistor T13 electrically coupled between differential amplify latch circuit 216 and power supply potential Vcc and ground potential Vss, respectively. Differential amplify latch circuit 216 is supplied with an operating current via transistors T3 and T14 with control signal RC as the trigger to initiate a differential amplify operation.

Similarly, transfer gates TG1 and TG2 cease transmission of external clocks EXT.CLK and EXT./CLK to nodes N1 and N2 with control signal RC as a trigger. Therefore, differential amplify latch circuit 216 locks the potential level difference between clocks EXT.CLK and EXT./CLK at the activation timing of control signal RC to amplify and latch the potential difference, and generates control signals UP and DOWN according to the latched information.

Figure 20:
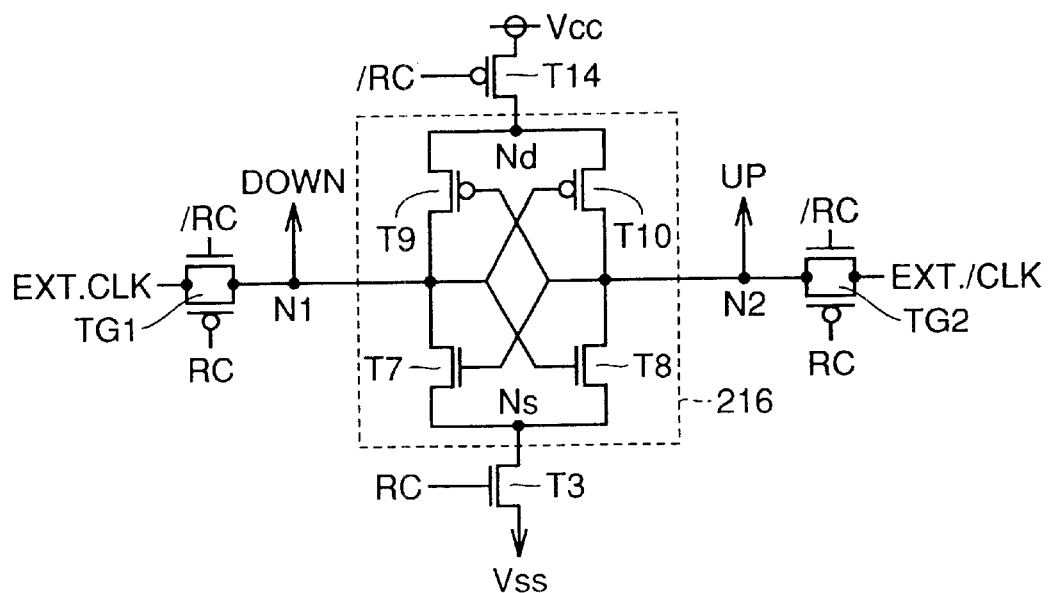
FIG. 20 is a circuit diagram to describe in detail a structure of a phase comparator according to the sixth example.

Referring to FIG. 20, transfer gates TG1 and TG2 are formed of CMOS gates operating in response to control signal RC. Transistor T3 is coupled between node Ns and ground potential Vss to receive an inverted signal /RC of control signal RC at its gate. Transistor T14 receives an inverted signal /RC of control signal RC at its gate.

Differential amplify latch circuit 216 includes P type MOS transistors T9 and T10 electrically coupled between node Nd and nodes N1 and N2, respectively, and N type MOS transistors T7 and T8 electrically coupled between node Ns and nodes N1 and N2, respectively. Transistors T7 and T9 have their gates coupled to node N2. Transistors T8 and T10 have their gates coupled to node N1.

The cross-coupled amplifier formed of transistors T7–T10 operates with activation (H level) of control signal RC as a trigger, whereby amplification of the potential difference between nodes N1 and N2 is initiated. At this timing, transfer gates TG1 and TG2 are turned off. Nodes N1 and N2 are disconnected from external clocks EXT.CLK and EXT./CLK.

Differential amplify latch circuit 216 latches the potential level of external clocks EXT.CLK and EXT./CLK at the activation (H level) timing of control signal RC to amplify and provide to nodes N1 and N2 the potential level difference. The relationship between the potential levels of complementary external clocks EXT.CLK and EXT./CLK at the activation timing of control signal RC and the relationship of the signal levels of control signals UP and DOWN indicating the phase comparison result are similar to those described with reference to FIG. 13. Therefore, description thereof will not be repeated.

By such a structure, the phase of the external clock defined at the timing where the potential levels of complementary external clocks EXT.CLK and EXT./CLK become equal is compared with the phase of control signal RC, i.e. the return clock, so that the phase comparison result can be reflected in control signals UP and DOWN for output.

Figure 21:
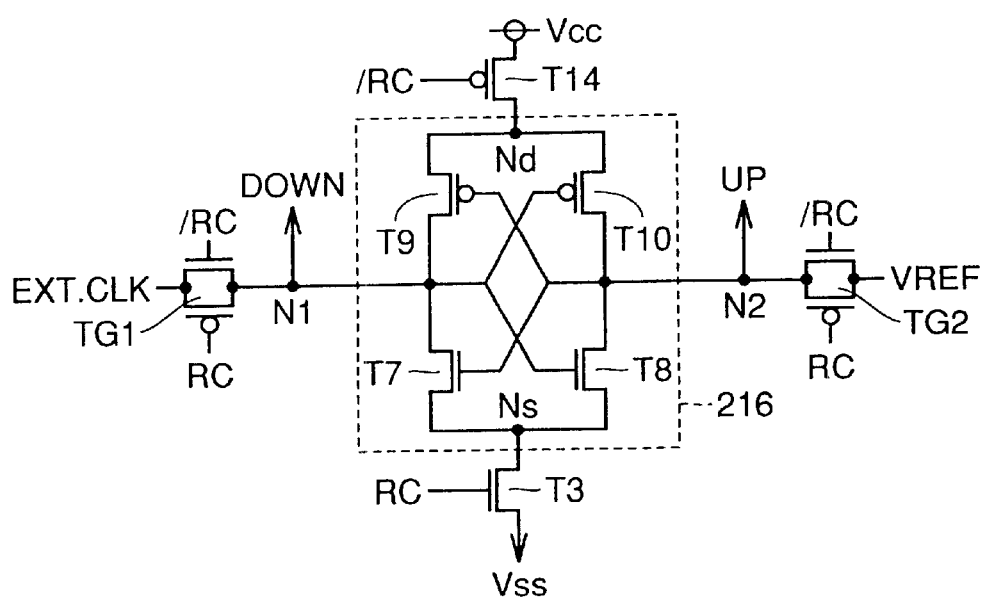
FIG. 21 is a circuit diagram showing a seventh example of a structure of phase comparator 210.
Figure 22:
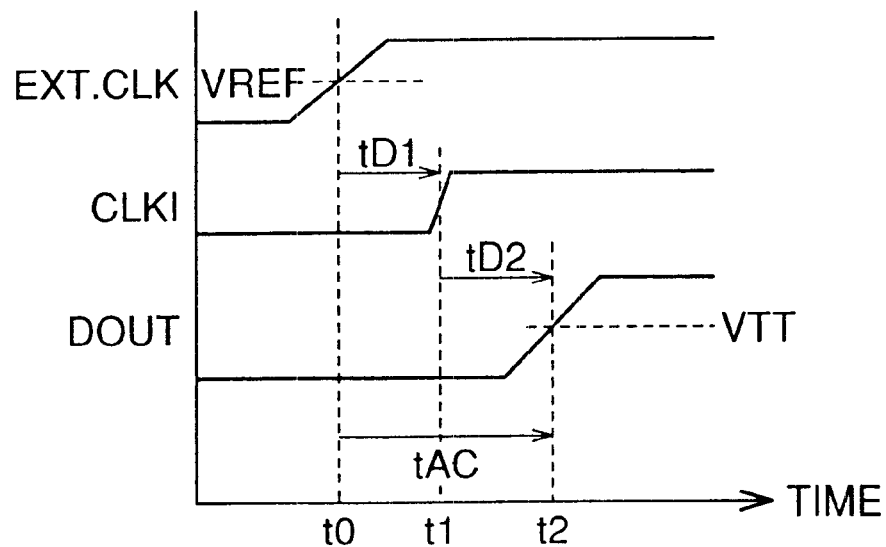
FIG. 22 is a timing chart to describe a data output timing in an SDRAM.
Figure 23:
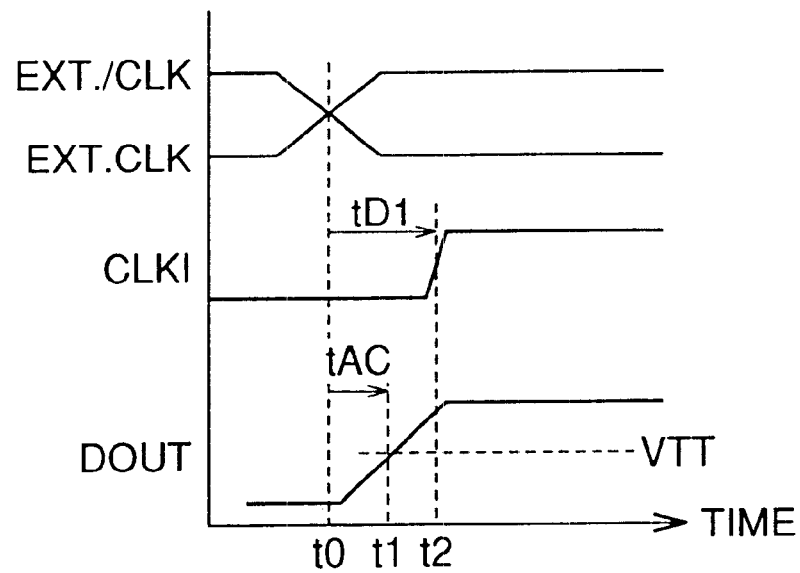
FIG. 23 is a timing chart showing a data output timing in a DDR-SDRAM.
Figure 24:
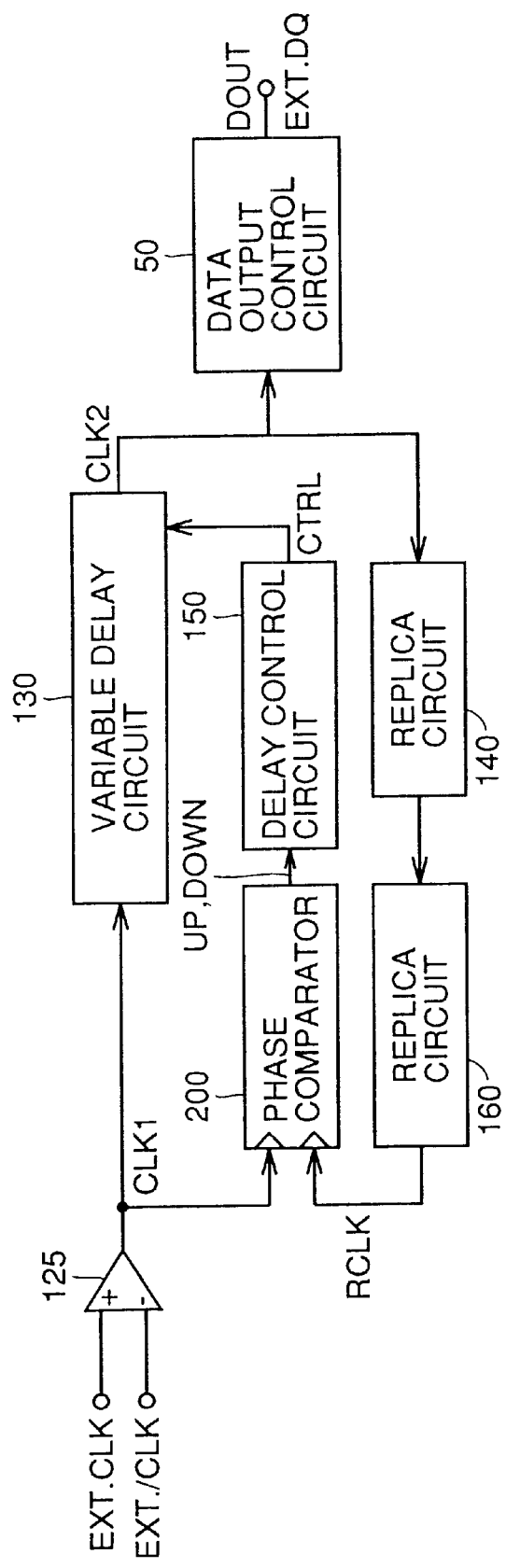
FIG. 24 is a block diagram showing a structure of a conventional clock generation circuit employing a DLL.

Referring to FIG. 21, phase comparator 210 according to a seventh structural example has a structure similar to that shown in FIG. 20, provided that the signal transmitted to node N2 via transfer gate TG2 is a reference voltage VREF to receive a single external clock EXT.CLK instead of inverted clock EXT./CLK. The remaining structure and operation are similar to those of phase comparator 210 of FIG. 20. Therefore, description thereof will not be repeated.

By such a structure, the phases between return clock RCLK and external clock EXT.CLK can be compared correctly even when the external clock is a single clock, not complementary clocks.

The phase comparator according to various structural examples described in the present tenth embodiment can be applied appropriately to phase comparators 210, 210a and 210b provided in the clock generation circuits of the first to ninth embodiments.

Although generation of an internal operation clock that becomes a trigger signal to execute the data input/output timing in a semiconductor memory device has been described as a typical example, the present invention is generally applicable to the supply of an operation clock with respect to an internal circuit that operates in synchronization with an external clock. In this case, data output control circuit 50 or data input latch circuit 40 according to the first to ninth embodiments of the present invention can be substituted in the internal circuitry to apply the structure of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock generation circuit supplying an operation clock in synchronization with an external clock with respect to an internal circuit executing a predetermined operation, comprising:
 a first clock input circuit receiving said external clock and an external reference clock which is a clock signal complementary to said external clock to generate a first internal clock,
 said first internal clock repeating a status transition between a first potential and a second potential higher than said first potential according to a potential level difference between said external clock and said external reference clock;
 a first variable delay circuit delaying said first internal clock to generate a second internal clock supplied to said internal circuit as said operation clock;

a first replica delay circuit further delaying said second internal clock for a first predetermined time corresponding to the time required for said predetermined operation in said internal circuit to generate a third internal clock;

a first phase comparator comparing a phase where potential levels of said external clock and said external reference clock cross with the phase of said third internal clock; and a first delay control circuit controlling a delay amount of said first variable delay circuit according to a phase comparison result of said first phase comparator.

2. The clock generation circuit according to claim 1, further comprising:

a second replica delay circuit further delaying said third internal clock for a second predetermined time corresponding to delay generated at said first clock input circuit to generate a fourth internal clock; and a second phase comparator comparing phases between said first internal clock and said fourth internal clock, wherein said first delay control circuit controls the delay amount of said first variable delay circuit according to a phase comparison result of said first and second phase comparators.

3. The clock generation circuit according to claim 1, further comprising:

a second clock input circuit receiving said external clock and said external reference clock to generate a first internal sub clock complementary to said first internal clock;

a second variable delay circuit delaying said first internal sub clock to generate a second internal sub clock supplied to said internal circuit as said operation clock;

a second replica delay circuit further delaying said third internal clock by a second predetermined time corresponding to delay generated at said first clock input circuit to generate a fourth internal clock; and a second phase comparator comparing phases between said first internal clock and said fourth internal clock, wherein said first delay control circuit controls the delay amount of said first and second variable delay circuits in common according to a phase comparison result of said first and second phase comparators.

4. The clock generation circuit according to claim 1, further comprising:

a second clock input circuit receiving said external clock and said external reference clock to generate a first internal sub clock complementary to said first internal clock;

a second variable delay circuit delaying said first internal sub clock to generate a second internal sub clock supplied to said internal circuit as said operation clock; and a clock select circuit receiving said second internal clock and said second internal sub clock to transmit to said first replica delay circuit either said second internal clock or said second internal sub clock according to a constant select cycle, wherein said first replica delay circuit further delays a clock sent from said clock select circuit by said first predetermined time to generate said third internal clock, said clock generation circuit further includes a second delay control circuit controlling a delay amount of said second variable delay circuit independent of said first delay control circuit according to a phase comparison result of said first phase comparator.

5. The clock generation circuit according to claim 1, further comprising:

a second clock input circuit receiving said external clock and said external reference clock to generate a first internal sub clock complementary to said first internal clock;

a second variable delay circuit delaying said first internal sub clock to generate a second internal sub clock supplied to said internal circuit as said operation clock;

a second replica delay circuit further delaying said second internal sub clock by said first predetermined time to generate a third internal sub clock;

a second phase comparator comparing a phase where potential levels of said external clock and said external reference clock cross with the phase of said third internal sub clock; and a second delay control circuit controlling a delay amount of said second variable delay circuit according to a phase comparison result of said second phase comparator.

6. The clock generation circuit according to claim 1, wherein said first phase comparator comprises a potential difference conversion circuit converting a potential level difference between said external clock and said external reference clock into a potential level difference between first and second internal nodes according to a potential level of said second internal clock, and a differential amplify circuit amplifying the potential level difference of said first and second internal nodes to retain an amplified result, wherein said potential difference conversion circuit includes a first transistor having a gate receiving said external clock, and electrically coupled to said first internal node, a second transistor having a gate receiving said external reference clock, and electrically coupled to said second internal node, and a current supply transistor turned on according to the potential level of said second internal clock to supply an operating current to said potential difference conversion circuit and said differential amplify circuit, wherein said differential amplify circuit renders active one of a first control signal to increase the delay amount of said first variable delay circuit and a second control signal to reduce the delay amount of said first variable delay circuit according to said amplified result.

7. The clock generation circuit according to claim 6, wherein said differential amplify circuit includes third and fourth transistors having gates electrically coupled to one of said first and second internal nodes, and provided between a node where said second potential is supplied and said first and second internal nodes, and a flip flop circuit setting a signal level of said first and second control signals according to a potential level of said first and second internal nodes.

8. The clock generation circuit according to claim 6, wherein said differential amplify circuit includes a third transistor having a gate electrically coupled to a third internal node, and electrically coupled between said second internal node and a fourth internal node, a fourth transistor having a gate electrically coupled to said fourth internal node, and electrically coupled between said first internal node and said third internal node, a fifth transistor electrically coupled between a power supply node supplying said second potential and said third internal node, having a gate electrically coupled to said fourth internal node, a sixth transistor electrically coupled between said potential supply node and said fourth internal node, and having a gate electrically coupled to said third internal node, seventh and eighth transistors turned on complementarily to said current supply transistor to electrically couple said potential supply node to said third and fourth internal nodes, and first and second logic gates generating said first control signal and said second control signal, respectively, according to respective potential levels of said third and fourth internal nodes.

9. The clock generation circuit according to claim 1, wherein said first phase comparator comprises a potential difference conversion circuit operating for a predetermined period during which a transition timing of said third internal clock from said first potential to said second potential occurs, and converting a potential level difference between said external clock and said external reference clock into a potential level difference between first and second internal nodes, and a differential amplify circuit operating after said predetermined period ends to amplify the potential level difference between said first and second internal nodes, and retaining an amplified result.

10. The clock generation circuit according to claim 9, said potential difference conversion circuit operating in response to activation of a first timing signal, wherein said first phase comparator includes a first current supply circuit supplying an operating current to said potential difference conversion circuit in response to activation of a second timing signal, and a second current supply circuit supplying an operating current to said differential amplify circuit in response to activation of a third timing signal, wherein said first and second timing signals are rendered active prior to said transition timing of said third internal clock, said second timing signal is rendered inactive after said transition timing of said third internal clock, said third timing signal is rendered active after inactivation of said second timing signal, said first and third timing signals are rendered inactive at a transition timing of said third internal clock from a second potential to a first potential, said differential amplify circuit rendering active one of a first control signal to increase a delay amount of said first variable delay circuit and a second control signal to reduce a delay amount of said first variable delay circuit according to potential levels of said first and second internal nodes.

11. The clock generation circuit according to claim 1, wherein said first phase comparator includes a first signal transmission gate operating according to a potential level of said third internal clock to transmit said external clock to a first internal node, a second signal transmission gate operating at a timing identical to the timing of said first signal transmission gate to transmit said external reference clock to said second internal node, a differential amplify circuit amplifying a potential level difference between said first and second internal nodes and retaining an amplified result, and a current supply circuit operating according to a potential level of said third internal clock to supply an operating current to said differential amplify circuit, wherein said first and second signal transmission gates and said current supply circuit are turned on/off complementarily, wherein said differential amplify circuit renders active one of a first control signal to increase a delay amount of said first variable delay circuit by a predetermined amount and a second control signal to reduce the delay amount of said first variable delay circuit by a predetermined amount, based on said amplified result.

12. The clock generation circuit according to claim 11, wherein said differential amplify circuit includes a cross-coupled type amplifier amplifying a potential level difference of said first and second internal nodes to set a potential level of said first and second internal nodes to any one of said first and second potentials, wherein said current supply circuit includes a first transistor electrically coupled between a first potential supply node supplying said first potential and said differential amplify circuit, and a second transistor electrically coupled between a second potential supply node supplying said second potential and said differential amplify circuit, said first and second transistors being turned on/off complementarily to said first and second signal transmission gates.

13. A clock generation circuit supplying an operation clock in synchronization with an external clock with respect to an internal circuit executing a predetermined operation, comprising:

a phase comparator comparing a phase where potential levels of said external clock and an external reference clock which is a clock signal complementary to said external clock cross with the phase of said operation clock;

a delay control circuit generating a delay control signal according to a phase comparison result of said phase comparator;

a control circuit generating an internal clock according to said operation clock; and a variable delay circuit delaying said internal clock according to said delay control signal to generate said operation clock.

14. The clock generation circuit according to claim 13, further comprising an adjustment delay circuit arranged between said variable delay circuit and said phase comparator to delay said operation clock by a predetermined time and sending the delayed operation clock to said phase comparator to adjust an execution timing of said predetermined operation.

15. A semiconductor memory device operating in synchronization with an external clock, comprising:

a clock generation circuit generating in synchronization with said external clock an operation clock to control a timing of an internal operation of said semiconductor memory device, said clock generation circuit including
a first clock input circuit receiving said external clock and an external reference clock which is a clock signal complementary to said external clock to generate a first internal clock,
said first internal clock repeating state transition according to a potential level difference between said external clock and said external reference clock,
said clock generation circuit further including
a variable delay circuit delaying said first internal clock to generate said operation clock,
a replica delay circuit further delaying said operation clock by a predetermined time to generate a second internal clock,
a phase comparator comparing a phase where potential levels of said external clock and said external reference clock cross with the phase of said second internal clock, and
a delay control circuit controlling a delay amount of said variable delay circuit according to a phase comparison result of said phase comparator.

16. The semiconductor memory device according to claim 15, said semiconductor memory device comprising:
   a memory array to store data, and
   a data output control circuit providing data read out from said memory array to an external source,
      wherein said data output control circuit executes data output in response to said operation clock,
      said predetermined time corresponding to the time required for said data output.

17. The semiconductor memory device according to claim 15, wherein said semiconductor memory device comprises:
   a memory array to store data, and
   a data input control circuit fetching externally applied write data to said memory array,
      said data input control circuit latching said write data in response to said operation clock,
      said predetermined time being determined corresponding to a timing of latching said write data.

* * * * *